United States Patent
Xiong et al.

(10) Patent No.: US 9,515,150 B2
(45) Date of Patent: Dec. 6, 2016

(54) SEMICONDUCTOR DEVICES AND METHODS OF MANUFACTURING THE SAME

(71) Applicant: Samsung Electronics Co., Ltd., Suwon-si (KR)

(72) Inventors: Junjie Xiong, Suwon-si (KR); Dongho Cha, Seongnam-si (KR); Myung Jin Kang, Yongin-si (KR); Kihoon Do, Hwaseong-si (KR)

(73) Assignee: Samsung Electronics Co, Ltd. (KR)

( * ) Notice: Subject to any disclaimer, the term of this patent is extended or adjusted under 35 U.S.C. 154(b) by 0 days.

(21) Appl. No.: 14/308,751

(22) Filed: Jun. 19, 2014

(65) Prior Publication Data

US 2015/0028399 A1 Jan. 29, 2015

(30) Foreign Application Priority Data

Jul. 23, 2013 (KR) .................. 10-2013-0086896

(51) Int. Cl.
| | |
|---|---|
| *H01L 29/417* | (2006.01) |
| *H01L 29/66* | (2006.01) |
| *H01L 29/78* | (2006.01) |
| *H01L 29/165* | (2006.01) |
| *H01L 21/8238* | (2006.01) |

(52) U.S. Cl.
CPC . *H01L 29/41725* (2013.01); *H01L 21/823814* (2013.01); *H01L 29/165* (2013.01); *H01L 29/66545* (2013.01); *H01L 29/66636* (2013.01); *H01L 29/7848* (2013.01); *H01L 29/665* (2013.01); *H01L 29/6656* (2013.01)

(58) Field of Classification Search
CPC ............... H01L 29/41725; H01L 29/66636; H01L 29/165; H01L 29/78; H01L 29/66545; H01L 29/7848; H01L 21/823814

See application file for complete search history.

(56) References Cited

U.S. PATENT DOCUMENTS

| | | | |
|---|---|---|---|
| 7,354,819 B2 | 4/2008 | Nakajima et al. | |
| 7,547,595 B2 | 6/2009 | Ning | |
| 7,655,516 B2 | 2/2010 | Ikeda | |
| 7,842,612 B2 * | 11/2010 | Nemouchi | ........ H01L 21/28097 257/E21.44 |
| 8,124,467 B2 | 2/2012 | Kronholz et al. | |
| 8,324,043 B2 | 12/2012 | Kim et al. | |
| 8,390,073 B2 | 3/2013 | Hung et al. | |
| 8,470,703 B2 | 6/2013 | Lee et al. | |

(Continued)

OTHER PUBLICATIONS

Yoshifumi Nishi et al., "Interfacial Segregation of Metal at NiSi/Si Junction for Novel Dual Silicide Technology," IEEE (2007), pp. 135-138.

(Continued)

*Primary Examiner* — Selim Ahmed
*Assistant Examiner* — Lauren R Bell
(74) *Attorney, Agent, or Firm* — Myers Bigel, P.A.

(57) ABSTRACT

Provided are semiconductor devices and methods of manufacturing the same. The methods include providing a substrate including a first region and a second region, forming first mask patterns in the first region, and forming second mask patterns having an etch selectivity with respect to the first mask patterns in the second region. The first mask patterns and the second mask patterns are formed at the same time.

6 Claims, 16 Drawing Sheets

(56) References Cited

U.S. PATENT DOCUMENTS

2008/0179673 A1* 7/2008 Fung .................. H01L 27/088
                                                     257/344
2009/0184341 A1   7/2009 Chong et al.
2009/0315185 A1  12/2009 Boyanov et al.
2010/0078735 A1   4/2010 Hoentschel et al.

OTHER PUBLICATIONS

Rinus Tek-Po Lee et al., "Novel and Cost-Efficient and Single Metallic Silicide Integration Solution with Dual Schottky-Barrier Achieved by Aluminum Inter-Diffusion for FinFET CMOS Technology with Enhanced Performance," IEEE Symposium on VLSI Technology Digest of Technical Papers (2008), pp. 28-29.

* cited by examiner

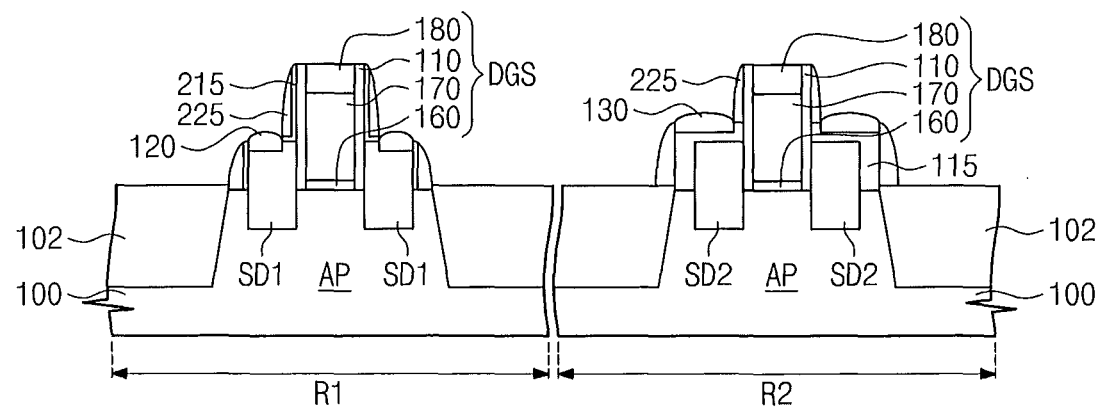
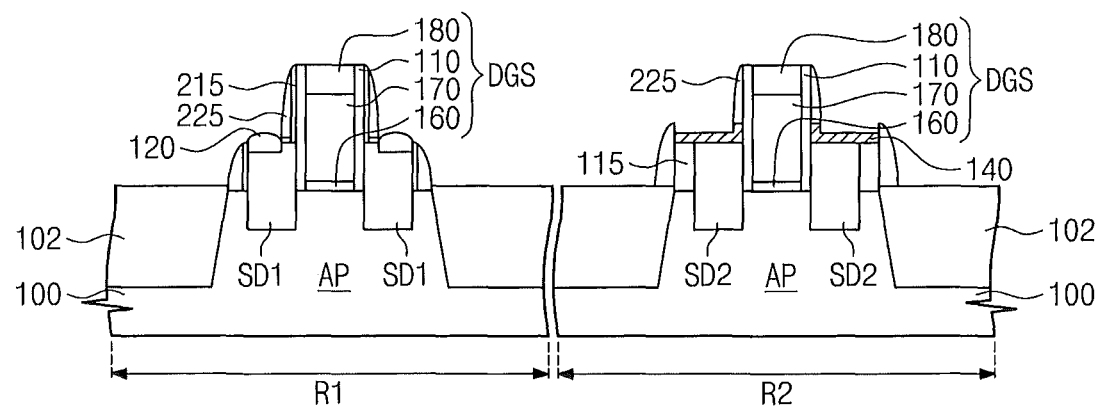

SEMICONDUCTOR DEVICES AND METHODS OF MANUFACTURING THE SAME

CROSS-REFERENCE TO RELATED APPLICATION

This U.S. non-provisional patent application claims priority under 35 U.S.C. §119 to Korean Patent Application No. 10-2013-0086896, filed on Jul. 23, 2013, in the Korean Intellectual Property Office, the disclosure of which is hereby incorporated by reference in its entirety.

BACKGROUND

The inventive concepts relate to semiconductor devices and methods of manufacturing the same and, more particularly, to semiconductor devices including field effect transistors and methods of manufacturing the same.

Semiconductor devices include integrated circuits having metal-oxide-semiconductor field effect transistors (MOSFETs). As sizes and design rules of semiconductor devices have been more and more reduced, sizes of MOSFETs have been continuously scaled down. The scaling down of the sizes of the MOSFETs may cause a short channel effect such that operating characteristics of the semiconductor devices may be deteriorated. Thus, various researches are being conducted for semiconductor devices capable of overcoming limitations caused by high integration of semiconductor devices and capable of improving performance of semiconductor devices.

SUMMARY

Embodiments of the inventive concepts may provide semiconductor devices capable of simplifying manufacturing processes and reducing manufacturing costs and methods of manufacturing the same.

Embodiments of the inventive concepts may also provide semiconductor devices capable of reducing a resistance of contact plugs and methods of manufacturing the same.

In some embodiments, methods of manufacturing a semiconductor device may include providing a substrate including a first region and a second region that is different from the first region, forming first mask patterns in the first region and forming, in the second region, second mask patterns having an etch selectivity with respect to the first mask patterns, while forming the first mask patterns. In some embodiments, forming the first mask patterns and forming the second mask patterns includes forming sacrificial patterns in at least one of the first region and the second region and performing an oxidation process on the substrate to oxidize the sacrificial patterns. Some embodiments include first source/drain regions in the first region and second source/drain regions in the second region. The sacrificial patterns may be formed on the first source/drain regions and may be oxidized to form the first mask patterns. Top surfaces of the second source/drain regions may be oxidized to form the second mask patterns.

In some embodiments, the sacrificial patterns include germanium (Ge). Some embodiments provide that the first mask patterns include germanium oxide and the second mask patterns include silicon oxide.

Some embodiments include selectively removing the first mask patterns, forming first patterns in the first region, removing the second mask patterns after forming the first patterns and forming second patterns in the second region.

In some embodiments, the first patterns include a first element and the second patterns include a second element that is different from the first element. Some embodiments include first source/drain regions in the first region and second source/drain regions in the second region. The first mask patterns may be formed on the first source/drain regions and the second mask patterns may be formed on the second source/drain regions. The first patterns may be ohmic patterns that contact the first source/drain regions and the second patterns may be ohmic patterns that contact the second source/drain regions.

In some embodiments, forming the first mask patterns includes forming sacrificial patterns on the first source/drain regions. Some embodiments provide that portions of the sacrificial patterns are oxidized to form the first mask patterns. In some embodiments, forming the first patterns includes forming a metal layer on residual portions of the sacrificial patterns that are not oxidized, reacting the metal layer with the residual portions of the sacrificial patterns and removing an unreacted portion of the metal layer that does not react with the residual portions of the sacrificial patterns. Some embodiments provide that the first patterns include a metal germanide.

In some embodiments, forming the first patterns includes removing residual portions of the sacrificial patterns that are not oxidized to expose the first source/drain regions, forming a metal layer on the exposed first source/drain regions, reacting the metal layer with the first source/drain regions and removing an unreacted portion of the metal layer that does not react with the first source/drain regions. In some embodiments, forming the second patterns includes forming a metal layer on the second source/drain regions exposed by removing the second mask patterns, reacting the metal layer with the second source/drain regions, and removing an unreacted portion of the metal layer that does not react with the second source/drain regions.

Some embodiments include forming first contact plugs that are electrically connected to the first source/drain regions and that have the first patterns arranged therebetween, and forming second contact plugs that are electrically connected to the second source/drain regions and that have the second patterns arranged therebetween.

Some embodiments of the present inventive concept are directed to a semiconductor device that includes a substrate including a first region and a second region, first source/drain regions in the first region, second source/drain regions in the second region, first contact plugs that are electrically connected to the first source/drain regions, second contact plugs electrically connected to the second source/drain regions, a first pattern between ones of the first source/drain regions and ones of the first contact plugs, the first pattern configured to provide ohmic contact between ones of the first source/drain regions and respective ones of the first contact plugs and a second pattern between ones of the second source/drain regions and ones of the second contact plugs, the second pattern configured to provide for ohmic contact between ones of the second source/drain regions and respective ones of the second contact plugs. The first pattern and the second pattern may include elemental semiconductors that are different from each other.

In some embodiments, the first patterns include a metal germanide and the second patterns include a metal silicide.

Some embodiments of the present inventive concept are directed to methods including forming first mask patterns having a first etch selectivity in a first region of a substrate, and while forming the first mask patterns, forming second mask patterns having a second etch selectivity that is different from the first etch selectivity in a second region of the substrate that is different from the first region of the substrate.

Some embodiments include selectively removing the first mask patterns, forming first patterns in the first region, removing the second mask patterns after forming the first patterns, and forming second patterns in the second region. In some embodiments, the substrate includes first source/drain regions in the first region and second source/drain regions in the second region. The first mask patterns may be on the first source/drain regions and the second mask patterns may be on the second source/drain regions. The first patterns may be ohmic patterns that contact the first source/drain regions and the second patterns may be ohmic patterns that contact the second source/drain regions.

In some embodiments, forming the first mask patterns includes forming sacrificial patterns on the first source/drain regions such that portions of the sacrificial patterns are oxidized to form the first mask patterns. Some embodiments provide that forming the first patterns includes forming a metal layer on residual portions of the sacrificial patterns that are not oxidized, reacting the metal layer with the residual portions of the sacrificial patterns, and removing an unreacted portion of the metal layer that does not react with the residual portions of the sacrificial patterns. In some embodiments, forming the second patterns includes forming a metal layer on the second source/drain regions exposed by removing the second mask patterns, reacting the metal layer with the second source/drain regions and removing an unreacted portion of the metal layer that does not react with the second source/drain regions.

Some embodiments include forming first contact plugs that are electrically connected to the first source/drain regions and that have the first patterns arranged therebetween and forming second contact plugs that are electrically connected to the second source/drain regions and that have the second patterns arranged therebetween.

It is noted that aspects of the inventive concept described with respect to one embodiment, may be incorporated in a different embodiments although not specifically described relative thereto. That is, all embodiments and/or features of any embodiments can be combined in any way and/or combination. These and other objects and/or aspects of the present inventive concept are explained in detail in the specification set forth below.

BRIEF DESCRIPTION OF THE DRAWINGS

The accompanying figures are included to provide a further understanding of the present inventive concept, and are incorporated in and constitute a part of this specification. The drawings illustrate some embodiments of the present inventive concept and, together with the description, serve to explain principles of the present inventive concept.

FIGS. 3 to 6, 7A, 8, and 9 are cross-sectional views illustrating methods of manufacturing a semiconductor device according to some embodiments of the inventive concepts.

DETAILED DESCRIPTION OF THE EMBODIMENTS

Figure 1:
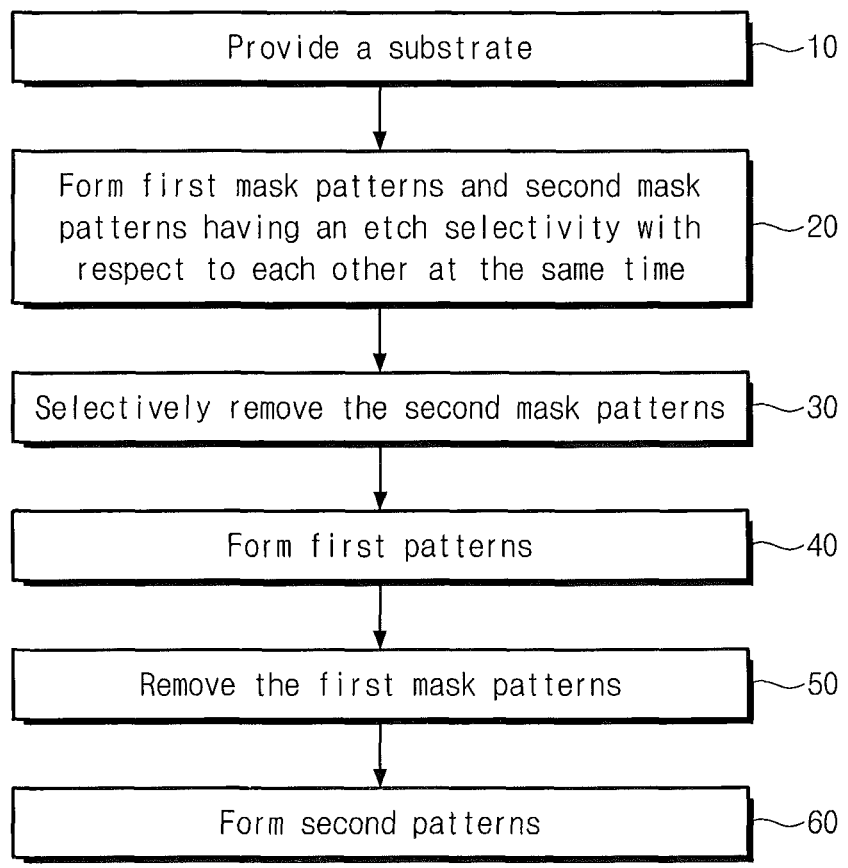
FIG. 1 is a flowchart illustrating methods of manufacturing a semiconductor device according to some embodiments of the inventive concepts.

The inventive concepts will now be described more fully hereinafter with reference to the accompanying drawings, in which example embodiments of the inventive concepts are shown. The advantages and features of the inventive concepts and methods of achieving them will be apparent from the following example embodiments that will be described in more detail with reference to the accompanying drawings. It should be noted, however, that the inventive concepts are not limited to the following example embodiments, and may be implemented in various forms. Accordingly, the example embodiments are provided only to disclose the inventive concepts and let those skilled in the art know the category of the inventive concepts. In the drawings, embodiments of the inventive concepts are not limited to the specific examples provided herein and are exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the embodiments in the detailed description will be described with sectional views as ideal example views of the inventive concepts. Accordingly, shapes of the example views may be modified according to manufacturing techniques and/or allowable errors. Therefore, the embodiments of the inventive concepts are not limited to the specific shape illustrated in the example views, but may include other shapes that may be created according to manufacturing processes. Areas exemplified in the drawings have general properties, and are used to illustrate specific shapes of elements. Thus, this should not be construed as limited to the scope of the inventive concepts.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Example embodiments of aspects of the present inventive concepts explained and illustrated herein include their complementary counterparts. The same reference numerals or the same reference designators denote the same elements throughout the specification.

Moreover, example embodiments are described herein with reference to cross-sectional illustrations and/or plane illustrations that are idealized example illustrations. Accordingly, variations from the shapes of the illustrations as a result, for example, of manufacturing techniques and/or tolerances, are to be expected. Thus, example embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

FIG. 1 is a flowchart illustrating methods of manufacturing a semiconductor device according to some embodiments of the inventive concepts. FIGS. 2A to 2D are conceptual diagrams illustrating methods of manufacturing a semiconductor device according to example embodiments of the inventive concepts.

Figure 2A:
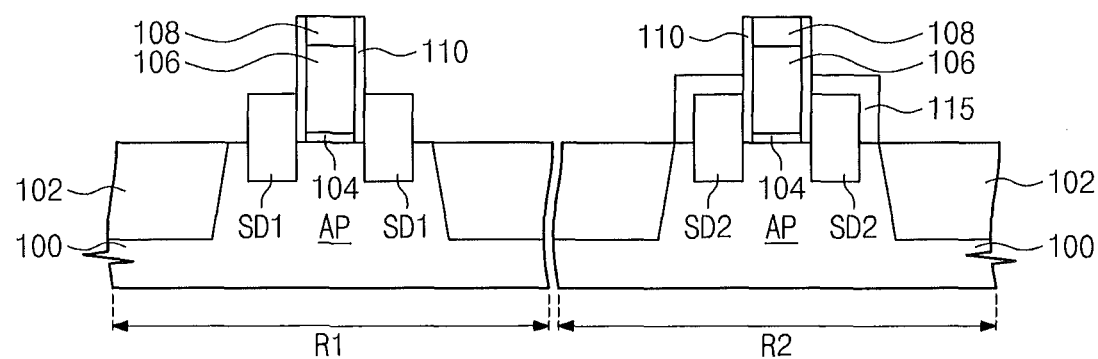
FIGS. 2A to 2D are conceptual diagrams illustrating methods of manufacturing a semiconductor device according to some embodiments of the inventive concepts.

Referring to FIGS. 1 and 2A, a substrate 100 including a first region R1 and a second region R2 may be provided (block 10). The substrate 100 may be a silicon substrate or a silicon-on-insulator (SOI) substrate, among others. The first region R1 and the second R2 may correspond to different regions from each other of the substrate 100. The first region R1 and the second region R2 may be regions requiring different threshold voltages from each other. In some embodiments, the first region R1 may be an NMOS region, and the second region R2 may be a PMOS region.

Device isolation patterns 102 may be formed in or on the substrate 100 to define active patterns AP. The device isolation patterns 102 may include an oxide, a nitride, and/or an oxynitride. A gate dielectric pattern 104, a gate pattern 106 and a capping pattern 108 that are sequentially stacked may be formed on each of the active patterns AP. In more detail, a gate dielectric layer, a gate layer, and a capping layer may be sequentially formed on the substrate 100. The capping layer, the gate layer, and the gate dielectric layer may be successively patterned to form the gate dielectric pattern 104, the gate pattern 106 and the capping pattern 108 that are sequentially stacked on each of the active patterns AP.

A spacer layer may be formed on an entire surface of the substrate 100 to cover the gate dielectric patterns 104, the gate patterns 106, and the capping patterns 108. The spacer layer may be etched to form gate spacers 110 covering sidewalls of the gate dielectric patterns 104, sidewalls of the gate patterns 106 and sidewalls of the capping patterns 108. Top surfaces of the capping patterns 108 and top surfaces of the device isolation patterns 102 may be exposed by the etching process performed on the spacer layer. Additionally, top surfaces of the active patterns AP at both sides of the gate patterns 106 may also be exposed by the etching process. In other words, the gate spacers 110 may be locally formed on the sidewalls of the gate dielectric patterns 104, the gate patterns 106 and the capping patterns 108.

Source/drain regions may be formed at both sides of each of the gate patterns 106. The source/drain regions may include first source/drain regions SD1 of the first region R1 and second source/drain regions SD2 of the second region R2. Forming the source/drain regions SD1 and SD2 may include removing portions of the active patterns AP at both sides of the gate patterns 106, and forming epitaxial patterns on the substrate 100. Forming epitaxial patterns may include forming first epitaxial patterns for the first source/drain regions SD1, and forming second epitaxial patterns for the second source/drain regions SD2. The first epitaxial patterns may be configured to induce tensile stress, and the second epitaxial patterns may be configured to induce compressive stress. In some embodiments, the first epitaxial patterns may be formed of silicon (Si) or silicon carbide (SiC), and the second epitaxial patterns may be formed of silicon-germanium (SiGe). However, the inventive concepts are not limited thereto. The source/drain regions SD1 and SD2 may be doped with dopants during or after the formation of the epitaxial patterns.

A sacrificial pattern 115 may be formed on at least one of the first and second source/drain regions SD1 and SD2. For the purpose of ease and convenience in explanation, the sacrificial patterns 115 formed on the second source/drain regions SD2 will be described an example. However, the inventive concepts are not limited thereto. The sacrificial patterns 115 may be formed by performing an epitaxial process. The epitaxial process for the formation of the second source/drain regions SD2 and the epitaxial process form the formation of the sacrificial patterns 115 may be sequentially performed. As illustrated in FIG. 2A, if the sacrificial patterns 115 are formed on only the second source/drain regions SD2, the sacrificial patterns 115 may include, for example, germanium (Ge). However, even though not shown in the drawings, if the sacrificial patterns 115 include first sacrificial patterns formed on the first source/drain regions SD1 and second sacrificial patterns formed on the second source/drain regions SD1, the first sacrificial patterns may include an element different from an element constituting the second sacrificial patterns. In some embodiments, the first sacrificial patterns may include germanium (Ge) and the second sacrificial patterns may include silicon (Si). In this case, buffer layers for epitaxial growth of the first and/or second sacrificial patterns may be further formed between the first source/drain regions SD1 and the first sacrificial patterns and/or between the second source/drain regions SD2 and the second sacrificial patterns. In some embodiments, the buffer layers may include silicon-germanium (SiGe).

Figure 2B:
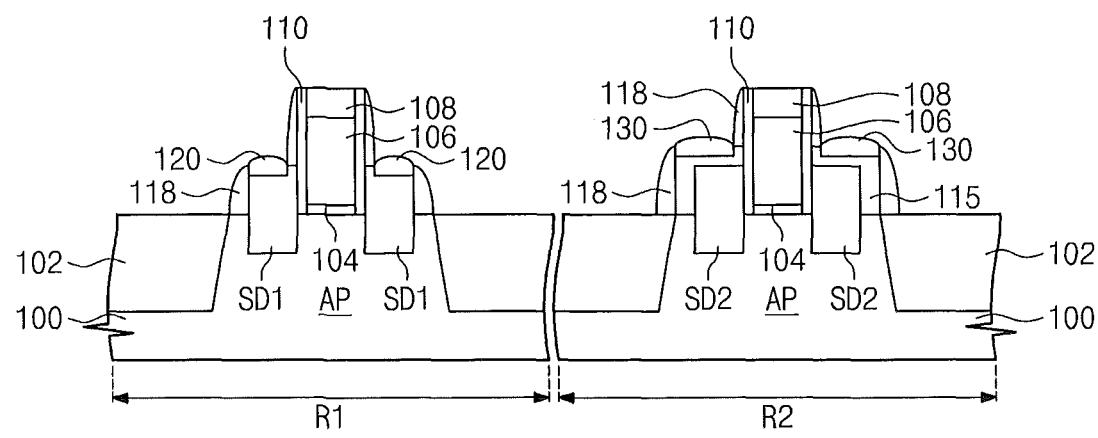

Referring to FIGS. 1 and 2B, a protection layer may be formed on an entire surface of the substrate 100. The protection layer may include a nitride (e.g., silicon nitride (SiN)). The protection layer may be etched to form sidewall protection patterns 118. The sidewall protection patterns 118 may protect sidewalls of the gate patterns 106 and the source/drain regions SD1 and SD2 from a subsequent etching process. The top surfaces of the capping patterns 108 and the top surfaces of the device isolation patterns 102 may be exposed by the etching process of the protection layer. Additionally, by the etching process of the protection layer, top surfaces of the first source/drain regions SD1 may be exposed in the first region R1 and top surfaces of the sacrificial patterns 115 may be exposed in the second region R2.

Thereafter, an oxidation process may be performed on the substrate 100. For example, the oxidation process may be a thermal oxidation process or a plasma oxidation process. The exposed top surfaces of the first source/drain regions SD1 may be oxidized by the oxidation process to form first mask patterns 120 in the first region R1. For example, the first mask patterns 120 may include silicon oxide. At the same time, the exposed top surfaces of the sacrificial patterns 115 may be oxidized by the oxidation process to form second mask patterns 130 in the second region R2. For example, the second mask patterns 130 may include germanium oxide. In this case, portions of the sacrificial patterns may not be oxidized but may remain during the oxidation process. The first mask patterns 120 may have an etch selectivity with respect to the second mask patterns 130. That is, the first mask patterns 120 may have an etch rate different from an etch rate of the second mask patterns 130. In other words, the first mask patterns 120 and the second mask patterns 130 that have different etch rates from each other may be formed in the first region R1 and the second region R2 at the same time by the oxidation process (block 20).

Figure 2C:
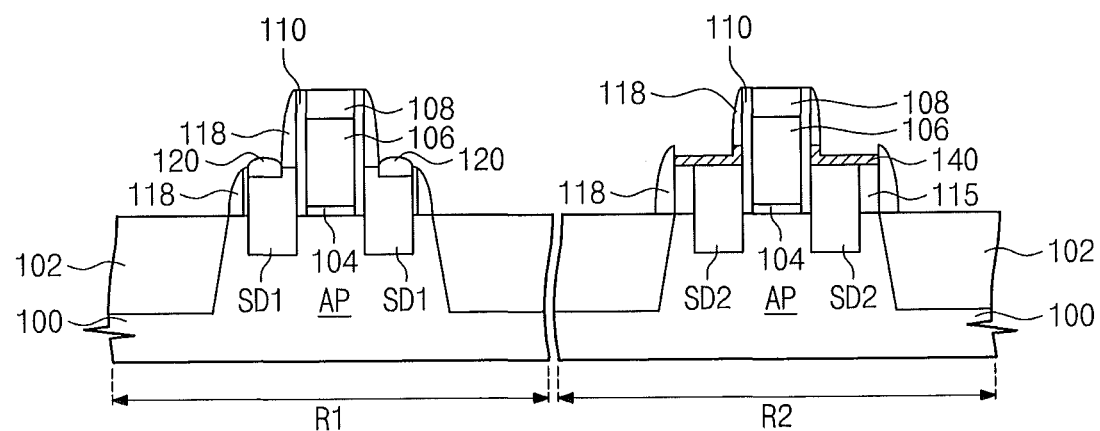

Referring to FIGS. 1 and 2C, the second mask patterns 130 may be removed using a difference between the etch rates of the first and second mask patterns 120 and 130 (block 30). The residual portions of the sacrificial patterns 115 that are not oxidized during the oxidation process may include first portions disposed on the top surfaces of the second source/drain regions SD2, and second portions disposed on the sidewalls of the second source/drain regions SD2. The first portions of the residual portions of the sacrificial patterns 115 may be removed along with the second mask patterns 130. The second portions of the residual portions of the sacrificial patterns 115 may remain on the sidewalls of the second source/drain regions SD2 after the removal of the second mask patterns 130. For example, the second mask patterns 130 and the first portions of the sacrificial patterns 115 may be removed by performing a wet etching process using an etchant including hydrogen peroxide and deionized water. The etching process for the removal of the second mask patterns 130 and the first portions of the sacrificial patterns 115 may be performed using a etch recipe having an etch selectivity with respect to the first mask patterns 120. The second mask patterns 130 and the first portions of the sacrificial patterns 115 may be removed to expose the top surfaces of the second source/drain regions SD2.

First patterns 140 may be formed on the exposed surfaces of the second source/drain regions SD2 (block 40). Forming the first patterns 140 may include forming a first metal layer on an entire surface of the substrate 100, reacting the first metal layer with the exposed surfaces of the second source/drain regions SD2, and removing an unreacted portion of the first metal layer that does not react with the second source/drain regions SD2. For example, the first metal layer may include titanium (Ti), nickel (Ni), cobalt (Co), and/or platinum (Pt), among others. The first metal layer may react with the exposed surfaces of the second source/drain regions SD2 by performing a first annealing process. The first metal layer may also react with remaining portions (i.e., the second portions) of the sacrificial patterns 115 by the first annealing process. Thus, the first patterns 140 may laterally extend from the top surfaces of the second source/drain regions SD2 onto the remaining portions of the sacrificial patterns 115. During the first annealing process, the first source/drain regions SD1 may not react with the first metal layer by the first mask patterns 120. The first patterns 140 may include a semiconductor-metal compound (e.g., a metal silicide). The first patterns 140 may be in contact with the second source/drain regions SD2. The first patterns 140 may be ohmic patterns for ohmic contact between the second source/drain regions SD2 and contact plugs electrically connected to the second source/drain regions SD2.

Figure 2D:
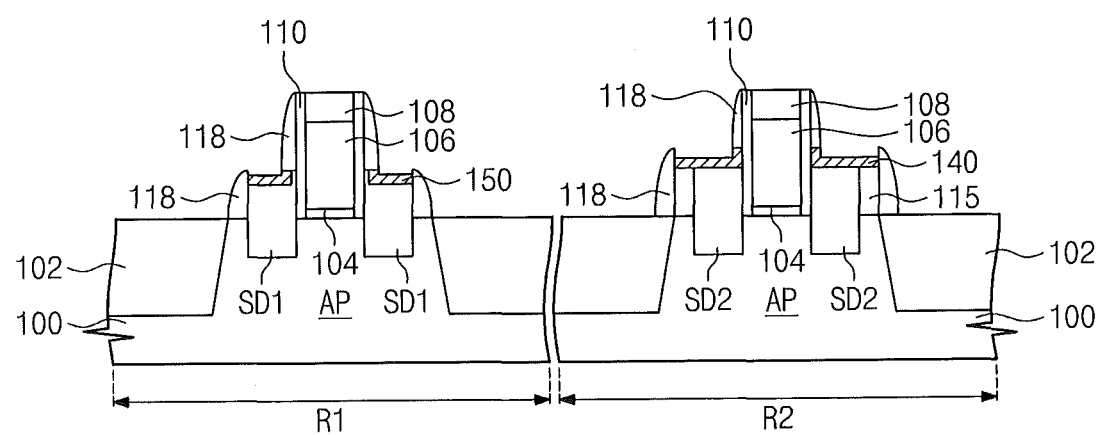

Referring to FIGS. 1 and 2D, the first mask patterns 120 may be removed after the formation of the first patterns 140 (block 50). For example, the first mask patterns 120 may be removed by a dry etching process and/or a wet etching process. The top surfaces of the first source/drain regions SD1 may be exposed by the removal of the first mask patterns 120. Second patterns 150 may be formed on the exposed top surfaces of the first source/drain regions SD1 (block 60). Forming the second patterns 150 may include forming a second metal layer on the entire surface of the substrate 100, reacting the second metal layer with the exposed top surfaces of the first source/drain regions SD1, and removing an unreacted portion of the second metal layer that does not react with the first source/drain regions SD1. For example, the second metal layer may include titanium (Ti), nickel (Ni), cobalt (Co), and/or platinum (Pt), among others. The second metal layer may react with the exposed first source/drain regions SD1 by performing a second annealing process. The second patterns 150 may include a semiconductor-metal compound (e.g., a metal silicide).

The first patterns 140 may include an element different from elements constituting the second patterns 150. Additionally, top surfaces of the first patterns 140 may react with the second metal layer during the second annealing process. Thus, the first patterns 140 may further include the same element as the element constituting the second patterns 150.

The second patterns 150 may be in contact with the first source/drain regions SD1. The second patterns 150 may be ohmic patterns that provide ohmic contact between the first source/drain regions SD1 and contact plugs electrically connected to the first source/drain regions SD 1.

According to some embodiments of the inventive concepts, the sacrificial patterns 115 may be formed on at least one of the source/drain regions SD1 and SD2 and then the oxidation process may be performed to form the first and second mask patterns 120 and 130 having the etch selectivity with respect to each other at the same time in the first region R1 and the second region R2, respectively. Thus, manufacturing processes of the semiconductor device may be simplified and manufacturing costs of the semiconductor device may be reduced. Additionally, the first patterns 140 in the second region R2 and the second patterns 150 in the first regions R1 may be formed using the etch selectivity of the first and second mask patterns 120 and 130. The first patterns 140 may include the element different from the elements constituting the second patterns 150. Thus, resistances of the contact plugs electrically connected to the source/drain regions SD1 and SD2 may be reduced by the second and first patterns 150 and 140.

FIGS. 3 to 6, 7A, 8, and 9 are cross-sectional views illustrating methods of manufacturing a semiconductor device according to some embodiments of the inventive concepts. In the present embodiments, the same elements as described with reference to FIGS. 1 and 2A to 2D will be indicated by the same reference numerals or the same reference designators, and the descriptions to the same elements will be omitted or mentioned briefly for the purpose of ease and convenience in explanation.

Figure 3:
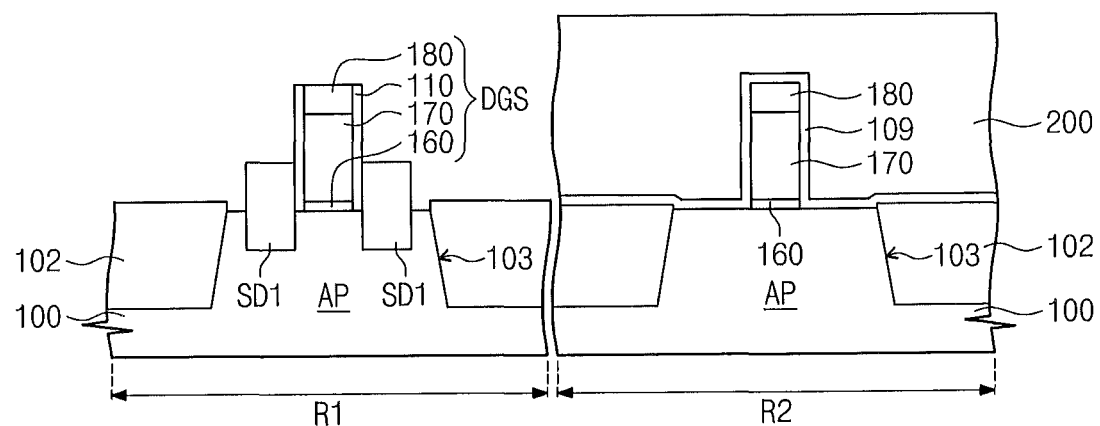

Referring to FIG. 3, a substrate 100 including a first region R1 and a second region R2 may be provided. The substrate 100 may be a silicon substrate or a SOI substrate. The first region R1 and the second region R2 correspond to different regions from each other. The first region R1 and the second region R2 may be regions requiring different threshold voltages from each other.

The substrate 100 may be patterned to form trenches 103 defining active patterns AP. Mask patterns may be formed on the substrate 100 and then the substrate 100 may be anisotropically etched using the mask patterns as etch masks to form the trenches 103. In some embodiments, a width of each trench 103 may be progressively less from a top toward a bottom of each trench 103. Thus, a width of each active pattern AP may be progressively less toward a top of each active pattern AP.

Device isolation patterns 102 may be formed to fill the trenches 103, respectively. In more detail, a device isolation layer may be formed to fill the trenches 103 and then the device isolation layer may be planarized until the mask patterns are exposed, thereby forming the device isolation patterns 102. The device isolation layer may include an oxide layer (e.g., a silicon oxide layer), a nitride layer (e.g., a silicon nitride layer), and/or an oxynitride layer (e.g., a silicon oxynitride layer), among others. Thereafter, the mask patterns may be removed to expose top surfaces of the active patterns AP.

A dummy gate dielectric layer, a dummy gate layer, and a dummy capping layer may be sequentially formed on the substrate 100. The dummy gate dielectric layer may be formed of, for example, a silicon oxide layer. The dummy capping layer may be formed of, for example, a silicon nitride layer. The dummy gate layer may be formed of, for example, a poly-silicon layer. Each of the dummy gate dielectric layer, the dummy gate layer and the dummy capping layer may be formed by a chemical vapor deposition (CVD) process, a physical vapor deposition (PVD) process, and/or an atomic layer deposition (ALD) process. The dummy capping layer, the dummy gate layer, and the dummy gate dielectric layer may be successively patterned to form a dummy gate dielectric pattern 160, a dummy gate pattern 170, and a dummy capping pattern 180 that are sequentially stacked in each of the first and second regions R1 and R2. Thereafter, a gate spacer layer 109 may be formed to cover the dummy gate dielectric patterns 160, the dummy gate patterns 170 and the dummy capping patterns 180 on an entire surface of the substrate 100.

A first mask layer 200 may be formed to cover the substrate 100 in the second region R2. The substrate 100 in the first region R1 may not be covered with the first mask layer 200. In the first region R1, the gate spacer layer 109 may be etched to form gate spacers 110 on sidewalls of the dummy gate dielectric pattern 160, the dummy gate pattern 170 and the dummy capping pattern 180. The dummy gate dielectric pattern 160, the dummy gate pattern 170, the dummy capping pattern and the gate spacers 110 in the first region R1 may constitute a dummy gate structure DGS.

By the etching process, a top surface of the dummy capping pattern 180 and top surfaces of the device isolation patterns 102 may be exposed in the first region R1. Additionally, the active pattern AP at both sides of the dummy gate structure DGS may be exposed by the etching process in the first region R1.

First source/drain regions SD1 may be formed at both sides of the dummy gate structure DGS. Forming the first source/drain regions SD1 may include removing portions of the active portion AP at the both sides of the gate structure DGS, and forming first epitaxial patterns on the substrate 100. The first epitaxial patterns may be configured to induce tensile stress. In some embodiments, the first epitaxial patterns may include silicon (Si) or silicon carbide (SiC), however, the inventive concepts are not limited thereto. The first source/drain regions SD1 may be doped with dopants during or after the formation of the first epitaxial patterns.

Figure 4:
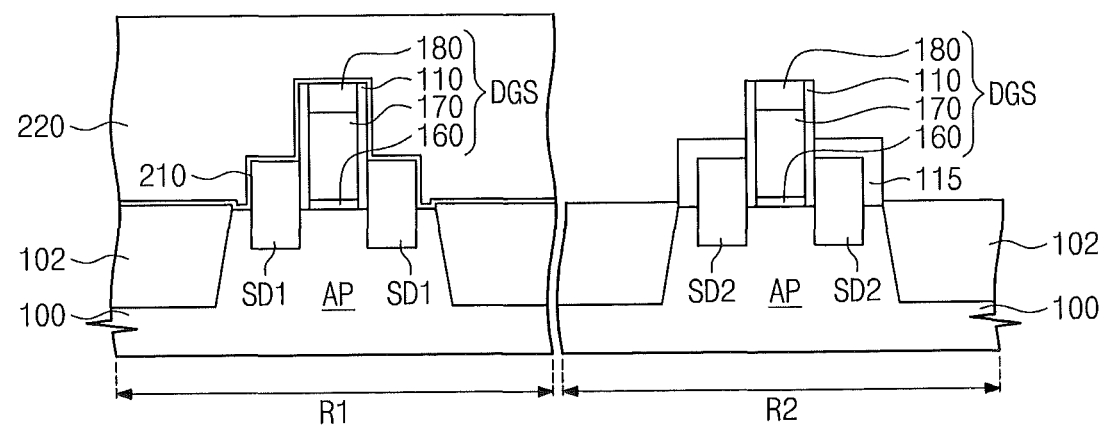

Referring to FIG. 4, a first etch stop layer 210 may be formed on the resultant structure of FIG. 3. The first etch stop layer 210 may be formed of a nitride layer (e.g., a silicon nitride layer). The first etch stop layer 210 may be formed to extend along outer surfaces of the dummy gate structure DGS and the first source/drain regions SD1 in the first region R1. The first etch stop layer 210 may be formed on the first mask layer 200 in the second region R2. Thereafter, the first mask layer 200 may be removed. In the second region R2, the first etch layer 210 formed on the first mask layer 200 may also be removed by the removal of the first mask layer 200.

A second mask layer 220 may be formed to cover the substrate 100 in the first region R1. The second mask layer 220 may include an oxide layer (e.g., a silicon oxide layer), a nitride layer (e.g., a silicon nitride layer), and/or an oxynitride layer (e.g., a silicon oxynitride layer), among others. The substrate 100 in the second region R2 may not be covered by the second mask layer 220. In the second region R2, the gate spacer layer 109 may be etched to form gate spacers 110 on sidewalls of the dummy gate dielectric pattern 160, the dummy gate pattern 170 and the dummy capping pattern 180. The dummy gate dielectric pattern 160, the dummy gate pattern 170, the dummy capping pattern 180 and the gate spacers 110 in the second region R2 may constitute a dummy gate structure DGS.

By the etching process, a top surface of the dummy capping pattern 180 and top surfaces of the device isolation patterns 102 may be exposed in the second region R2. Additionally, the active pattern AP at both sides of the dummy gate structure DGS may be exposed by the etching process in the second region R2.

Second source/drain regions SD2 may be formed at both sides of the dummy gate structure DGS in the second region R2. Forming the second source/drain regions SD2 may include removing portions of the active portion AP at the both sides of the gate structure DGS in the second region R2, and forming second epitaxial patterns on the substrate 100. The second epitaxial patterns may be configured to induce compressive stress. In some embodiments, the second epitaxial patterns may include silicon-germanium (SiGe), however, the inventive concepts are not limited thereto. The second source/drain regions SD2 may be doped with dopants during or after the formation of the second epitaxial patterns.

Sacrificial patterns 115 may be formed on the second source/drain regions SD2, respectively. The sacrificial patterns 115 may be formed by an epitaxial process. The epitaxial process for the formation of the second source/drain regions SD2 and the epitaxial process for the formation of the sacrificial patterns 115 may be continuously performed. For example, the sacrificial patterns 115 may include germanium (Ge).

Referring to FIG. 5, the second mask layer 220 may be removed and then a second etch stop layer (not shown) may be formed on an entire surface of the substrate 100. The second etch stop layer may extend along a top surface of the first etch stop layer 210 in the first region R1 and may extend along outer surfaces of the dummy gate structure DGS and the sacrificial patterns 115 in the second region R2. The second etch stop layer and the first etch stop layer 210 may be etched to form first etch stop patterns 215 and second etch stop patterns 225. In the first region R1, the first etch stop patterns 215 and the second etch stop patterns 225 may be formed on both sidewalls of the dummy gate structure DGS and sidewalls of the first source/drain regions SD1. A top surface of the dummy gate structure DGS and top surfaces of the first source/drain regions SD1 may be exposed in the first region R1 by the etching process. Additionally, the top surfaces of the device isolation patterns 102 may be exposed in the first region R1 by the etching process. At the same time, the second etch stop patterns 225 may be formed on both sidewalls of the dummy gate structure DGS and sidewalls of the sacrificial patterns 115 in the second region R2. A top surface of the dummy gate structure DGS and top surfaces of the sacrificial patterns 115 may also be exposed in the second region R2 by the etching process for the formation of the second etch stop patterns 225. Additionally, the top surfaces of the device isolation patterns 102 may also be exposed in the second region R2 by the etching process.

Thereafter, an oxidation process may be performed on the substrate 100. For example, the oxidation process may be a thermal oxidation process and/or a plasma oxidation process. The exposed top surfaces of the first source/drain regions SD1 may be oxidized by the oxidation process to form first mask patterns 120 in the first region R1. The first mask patterns 120 may include, for example, silicon oxide. At the same time, the exposed top surfaces of the sacrificial patterns 115 may be oxidized by the oxidation process to form second mask patterns 130 in the second region R2. For example, the second mask patterns 130 may include germanium oxide. In this case, portions of the sacrificial patterns 115 may not be oxidized during the oxidation process but may remain. The first mask patterns 120 may have an etch selectivity with respect to the second mask patterns 130. In other words, the first mask patterns 120 may have an etch rate different from an etch rate of the second mask patterns 130.

Referring to FIG. 6, the second mask patterns 130 may be selectively removed. Additionally, portions of the sacrificial patterns 115 that are not oxidized by the oxidation process may also be removed. The second mask patterns 130 and the portions of the sacrificial patterns 115 may be removed by, for example, a wet etching process using an etchant including hydrogen peroxide and deionized water. The etching process may be performed using an etch recipe an etch selectivity with respect to the first mask patterns 120. Since the second mask patterns 130 and the portions of the sacrificial patterns 115 are removed, the top surfaces of the second source/drain regions SD2 may be exposed.

First patterns 140 may be formed on the exposed second source/drain regions SD2. Forming the first patterns 140 may include forming a first metal layer on an entire surface of the substrate 100, reacting the first metal layer with the exposed second source/drain regions SD2, and removing an unreacted portion of the first metal layer that does not react with the second source/drain regions SD2. For example, the first metal layer may include titanium (Ti), nickel (Ni), cobalt (Co), and/or platinum (Pt), among others. The first metal layer may react with the exposed surfaces of the second source/drain regions SD2 by a first annealing process. During the first annealing process, the first source/drain regions SD1 may not react with the first metal layer by the first mask patterns 120. The first patterns 140 may include a semiconductor-metal compound (e.g., a metal silicide). The first patterns 140 may be in contact with the second source/drain regions SD2.

Figure 7A:
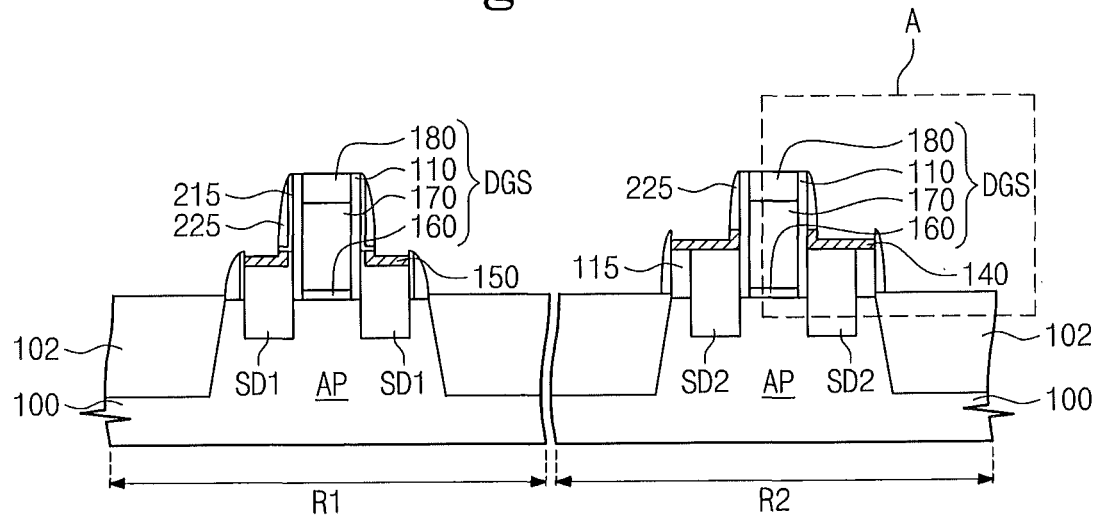

Referring to FIG. 7A, the first mask patterns 120 may be removed after the formation of the first patterns 140. For example, the first mask patterns 120 may be removed by a dry etching process or a wet etching process. The top surfaces of the first source/drain regions SD1 may be exposed by the removal of the first mask patterns 120. Second patterns 150 may be formed on the exposed top surfaces of the first source/drain regions SD1. Forming the second patterns 150 may include forming a second metal layer on the entire surface of the substrate 100, reacting the second metal layer with the exposed first source/drain regions SD1, and removing an unreacted portion of the second metal layer that does not react with the first source/drain regions SD1. For example, the second metal layer may include titanium (Ti), nickel (Ni), cobalt (Co), and/or platinum (Pt), among others. The second metal layer may react with the exposed first source/drain regions SD1 by a second annealing process. The second patterns 150 may include a semiconductor-metal compound (e.g., a metal silicide). The second patterns 150 may be in contact with the first source/drain regions SD 1.

Figure 7B:
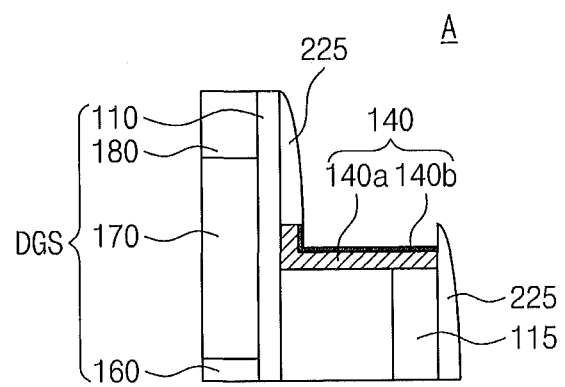
FIG. 7B is an enlarged view of a portion 'A' of FIG. 7A.

FIG. 7B is an enlarged view of a portion 'A' of FIG. 7A. Referring to FIG. 7B, top surfaces of the first patterns 140 may react with the second metal layer during the second annealing process. Thus, each of the first patterns 140 may include a first sub-pattern 140a formed by the reaction of the first metal layer and the second source/drain region SD2, and a second sub-pattern 140b formed by the reaction of the second metal layer and a top surface of the first sub-pattern 140a. The first patterns 140 may include an element different from elements constituting the second patterns 150.

Figure 8:
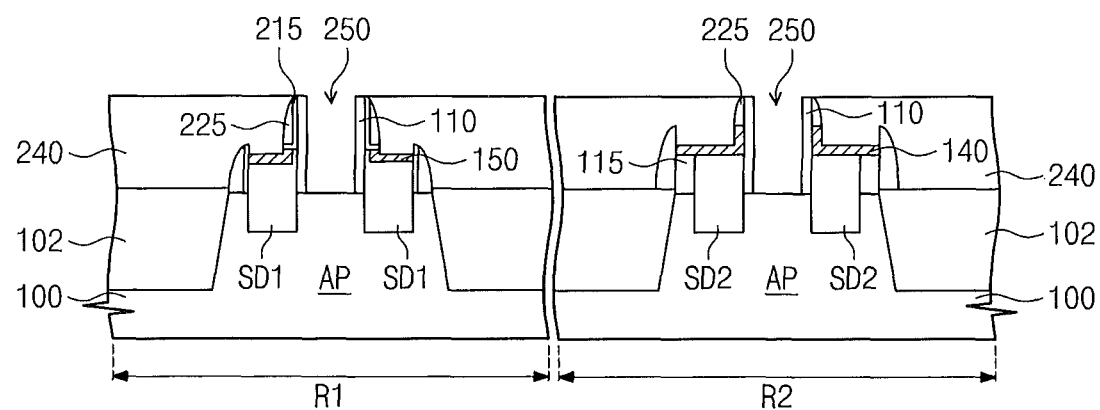

Referring to FIG. 8, a first interlayer insulating layer 240 may be formed on the resultant structure of FIG. 7. The first interlayer insulating layer 240 may include an oxide layer (e.g., a silicon oxide layer), a nitride layer (e.g., a silicon nitride layer), and/or an oxynitride layer (e.g., a silicon oxynitride layer), among others. The first interlayer insulating layer 240 may be planarized until the top surfaces of the dummy gate patterns 170 are exposed. Thereafter, the dummy gate patterns 170 may be removed to form gap regions 250 of which each exposes the substrate 100 between the gate spacers 110. Forming the gap regions 250 may include etching the dummy gate patterns 170 by an etching process having an etch selectivity with respect to the gate spacers 110, the first interlayer insulating layer 240 and the dummy gate dielectric patterns 160. Additionally, forming the gap regions 250 may further include removing the dummy gate dielectric patterns 160 to expose the active patterns AP.

Figure 9:
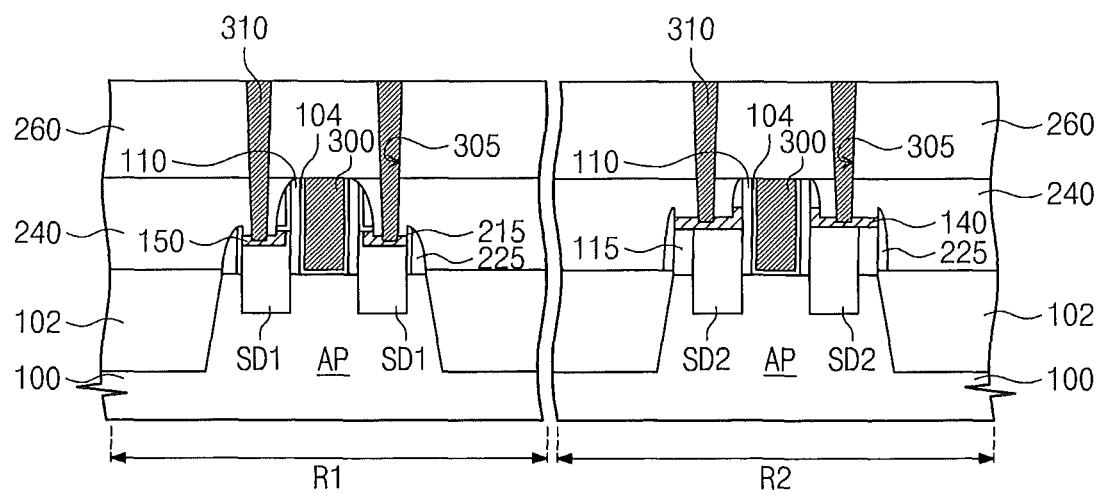

Referring to FIG. 9, a gate dielectric pattern 104 and a gate electrode 300 may be formed to fill the gap region 250 in each of the first and second regions R1 and R2.

A third mask layer (not shown) may be formed to cover the substrate 100 in the second region R2. The third mask layer may have an etch selectivity with respect to the first interlayer insulating layer 240, the gate spacers 110, and the substrate 100. For example, the third mask layer may be formed of an oxide layer (e.g., a silicon oxide layer), a nitride layer (e.g., a silicon nitride layer), and/or an oxynitride layer (e.g., a silicon oxynitride layer), among others. A gate dielectric layer (not shown) may be formed on the entire surface of the substrate 100 to partially fill the gap region 250 in the first region R1. The gate dielectric layer may include at least one of high-k dielectric layers. For example, the gate dielectric layer may include at least one of hafnium oxide, hafnium silicate, zirconium oxide, and zirconium silicate, among others. However, the inventive concepts are not limited to the aforementioned materials of the gate dielectric layer. The gate dielectric layer may be formed by, for example, an ALD process. A gate layer (not shown) may be formed on the gate dielectric layer to fill the rest region of the gap region 250 of the first region R1. The gate layer may include at least one of a conductive metal nitride (e.g., titanium nitride and/or tantalum nitride) and a metal (e.g., aluminum and/or tungsten). The gate layer and the gate dielectric layer may be planarized to form the gate dielectric pattern 104 and the gate electrode 300 in the first region R1. Top surfaces of the first interlayer insulating layer 240 and the gate spacers 110 may be exposed in the first region R1 by the planarization process. The second region R2 may be protected by the third mask layer during the planarization process. According to some embodiments, the gate dielectric pattern 104 may be formed between the gate electrode 300 and the active pattern AP and between the gate electrode 300 and the gate spacers 110. The third mask layer may be removed to expose the gap region 250 of the second region R2.

Thereafter, a fourth mask layer (not shown) may be formed to cover the substrate 100 in the first region R1. The fourth mask layer may have an etch selectivity with respect to the first interlayer insulating layer 240, the gate spacers 110, and the substrate 100. For example, the fourth mask layer may be formed of an oxide layer (e.g., a silicon oxide layer), a nitride layer (e.g., a silicon nitride layer), and/or an oxynitride layer (e.g., a silicon oxynitride layer), among others. A gate dielectric pattern 104 and a gate electrode 300 may be formed to fill the gap region 250 in the second region R2 by the same method as the method of forming the gate dielectric pattern 104 and the gate electrode 300 in the first region R1. The gate dielectric pattern 104 in the first region R1 may be formed of a different material from the gate dielectric pattern 104 in the second region R2. The gate electrode 300 in the first region R1 may be formed of a different material from the gate electrode 300 in the second region R2.

If the semiconductor device according to the inventive concepts includes a complementary metal-oxide-semiconductor (CMOS) structure, forming the gate electrodes 300 may include forming a gate electrode of an NMOS field effect transistor, and forming a gate electrode of a PMOS field effect transistor independently of the gate electrode of the NMOS field effect transistor. However, the inventive concepts are not limited to the above embodiments of forming the NMOS field effect transistor and the PMOS field effect transistor independently of each other.

A second interlayer insulating layer 260 may be formed on the resultant structure including the gate electrodes 300. Contact holes 305 may be formed to penetrate the second interlayer insulating layer 260 and the first interlayer insulating layer 240. The contact holes 305 may expose the first patterns 140 and the second patterns 150, respectively. Subsequently, contact plugs 310 may be formed to fill the contact holes 305, respectively. The contact plugs 310 may include at least one of a conductive metal nitride (e.g., titanium nitride or tantalum nitride) and a metal (e.g., aluminum or tungsten). The contact plugs 310 in the first region R1 may be in contact with the second patterns 150 and may be electrically connected to the first source/drain regions SD1. In other words, the second patterns 150 may be ohmic patterns that provide ohmic contact between the contact plugs 310 and the first source/drain regions SD 1.

The contact plugs 310 in the second region R2 may be in contact with the first patterns 140 and may be electrically connected to the second source/drain regions SD2. In other words, the first patterns 140 may be ohmic patterns that provide ohmic contact between the second source/drain regions SD2 and the contact plugs 310 of the second region R2.

According to some embodiments of the inventive concepts, the first and second mask patterns 120 and 130 having the different etch rates from each other may be respectively formed in the first region R1 and the second R2 at the same time. Thus, manufacturing processes of the semiconductor device may be simplified and manufacturing costs of the semiconductor device may be reduced. Additionally, the second patterns 150 and the first patterns 140 may be formed using the etch selectivity of the first and second mask patterns 120 and 130 in the first region R1 and the second region R2, respectively. The first patterns 140 may include the element different from the elements constituting the second patterns 150. Thus, resistance of the contact plugs electrically connected to the source/drain regions SD1 and SD2 may be reduced by the second and first patterns 150 and 140 therebetween.

Figure 10A:
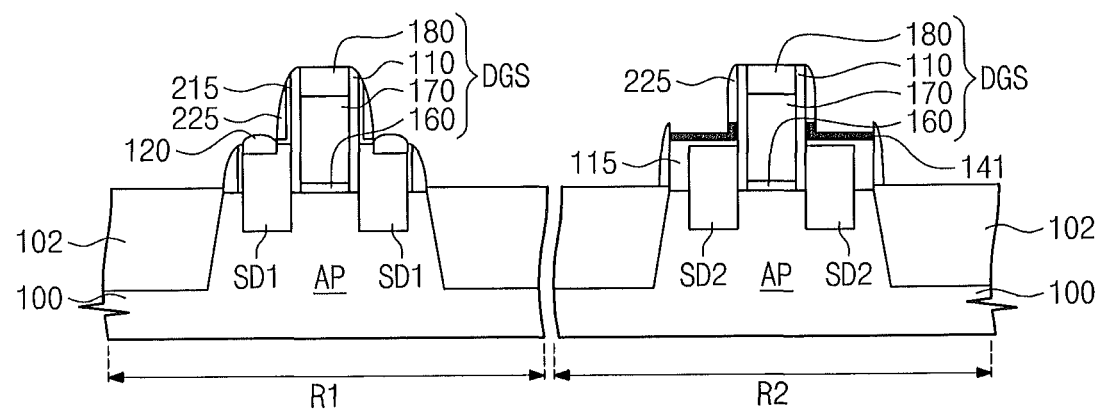
FIGS. 10A and 10B are cross-sectional views illustrating a modified example of methods of manufacturing a semiconductor device according to some embodiments of the inventive concepts.
Figure 10B:
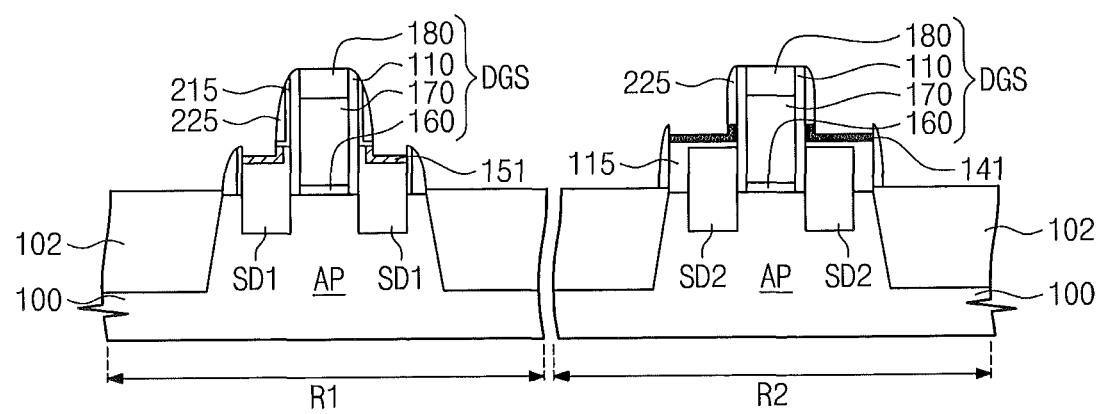

FIGS. 10A and 10B are cross-sectional views illustrating modified examples of methods of manufacturing a semiconductor device according to some embodiments of the inventive concepts. In the present modified examples, the same elements as described with reference of FIGS. 3 to 6, 7A, 7B, 8, and 9 will be indicated by the same reference numerals or the same designators, and the descriptions to the same elements will be omitted or mentioned briefly for the purpose of ease and convenience in explanation.

Referring to FIG. 10A, the second mask patterns 130 may be selectively removed from the resultant structure described with reference to FIG. 5. For example, the second mask patterns 130 may be removed by a wet etching process using an etchant including hydrogen peroxide and deionized water. In some embodiments, residual portions of the sacrificial patterns 115 that are not oxidized by the oxidation process may remain on the top surfaces of the second source/drain regions SD2. Thus, top surfaces of the sacrificial patterns 115 may be exposed by the removal of the second mask patterns 130.

Third patterns 141 may be formed on the exposed top surfaces of the sacrificial patterns 115. Forming the third patterns 141 may include forming a third metal layer on an entire surface of the substrate, reacting the third metal layer with the exposed sacrificial patterns 115, and removing an unreacted portion of the third metal layer that does not react with the sacrificial patterns 115. For example, the third metal layer may include titanium (Ti), nickel (Ni), cobalt (Co) and/or platinum (Pt), among others. The third metal layer may react with the exposed sacrificial patterns 115 by a third annealing process. The first source/drain regions SD 1 may not react with the third metal layer by the first mask patterns 120. The third patterns 141 may include a semiconductor-metal compound (e.g., a metal germanide).

Referring to FIG. 10B, the first mask patterns 120 may be removed after the formation of the third patterns 141. The top surfaces of the first source/drain regions SD1 may be exposed by the removal of the first mask patterns 120. Fourth patterns 151 may be formed on the exposed first source/drain regions SD1. Forming the fourth patterns 151 may include forming a fourth metal layer on an entire surface of the substrate 100, reacting the fourth metal layer with the exposed first source/drain regions SD1, and removing an unreacted portion of the fourth metal layer that does not react with the first source/drain regions SD1. For example, the fourth metal layer may include titanium (Ti), nickel (Ni), cobalt (Co) and/or platinum (Pt), among others. The fourth metal layer may react with the exposed first source/drain regions SD1 by a fourth annealing process. The fourth patterns 151 may include a semiconductor-metal compound (e.g., a metal silicide).

Top surfaces of the third patterns 141 may react with the fourth metal layer during the fourth annealing process. Thus, the third patterns 141 may include an element constituting the fourth metal layer. In some embodiments, the third patterns 141 may further include an element different from elements constituting the fourth patterns 151. Subsequent processes may be the same as the processes described with reference to FIGS. 8 and 9.

Figure 11A:
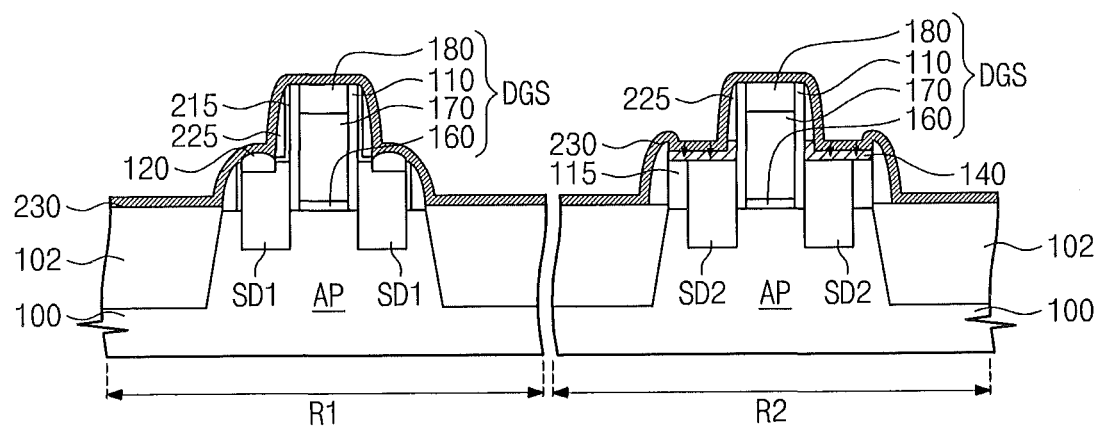
FIGS. 11A and 11B are cross-sectional views illustrating another modified example of methods of manufacturing a semiconductor device according to some embodiments of the inventive concepts.
Figure 11B:
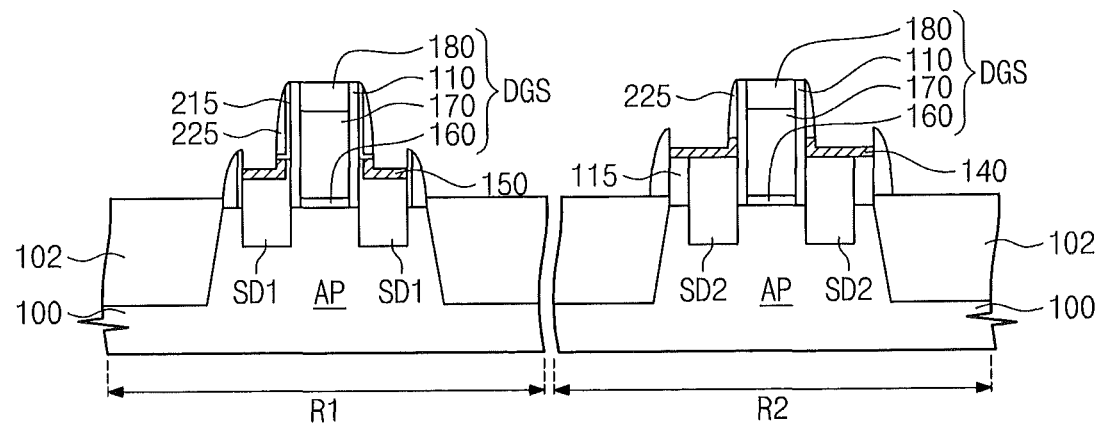

FIGS. 11A and 11B are cross-sectional views illustrating other modified examples of methods of manufacturing a semiconductor device according to some embodiments of the inventive concepts. In the present modified examples, the same elements as described with reference of FIGS. 3 to 6, 7A, 7B, 8, and 9 will be indicated by the same reference numerals or the same designators, and the descriptions to the same elements will be omitted or mentioned briefly for the purpose of ease and convenience in explanation.

Referring to FIG. 11A, a conductive layer 230 may be formed on the resultant structure described with reference to FIG. 6. The conductive layer 230 may include a metal. For example, the conductive layer 230 may include titanium (Ti), nickel (Ni), cobalt (Co) and/or platinum (Pt), among others. An annealing process may be performed on the resultant structure including the conductive layer 230. During the annealing process, metal atoms of the conductive layer 230 may be diffused into the first patterns 140 and then may be segregated in lower portions of the first patterns 140. Thus, a Schottky barrier may be generated in an interface between each of the first patterns 140 and each of the second source/drain regions SD2. However, the metal atoms of the conductive layer 230 may not be diffused into the first source/drain regions SD1 during the annealing process. In other words, the first mask patterns 120 on the first source/drain regions SD1 may function as diffusion barriers of the metal atoms of the conductive layer 230.

Referring to FIG. 11B, the conductive layer 230 may be removed. The first patterns 140 may further include the metal atoms of the conductive layer 230. Thereafter, the first mask patterns 120 may be removed. The top surfaces of the first source/drain regions SD 1 may be exposed by the removal of the first mask patterns 120. Second patterns 150 may be formed on the exposed first source/drain regions SD 1. The second patterns 150 may be formed by the same method as described with reference to FIG. 7A. Subsequent processes may be the same as the processes described with reference to FIGS. 8 and 9.

The modified examples described above of the inventive concepts are described using the elements of the embodiments mentioned with reference to FIGS. 3 to 6, 7A, 7B, 8, and 9. However, the technical features of the modified examples of the inventive concepts are not limited to the embodiments of FIGS. 6, 7A, 7B, 8, and 9. Additionally, the above modified examples of the inventive concepts may be combined with each other as the need arises.

FIGS. 12 to 18 are cross-sectional views illustrating methods of manufacturing a semiconductor device according to some other embodiments of the inventive concepts. In the present embodiments, the same elements as described with reference of FIGS. 3 to 6, 7A, 7B, 8, and 9 will be indicated by the same reference numerals or the same designators, and the descriptions to the same elements will be omitted or mentioned briefly for the purpose of ease and convenience in explanation.

Figure 12:
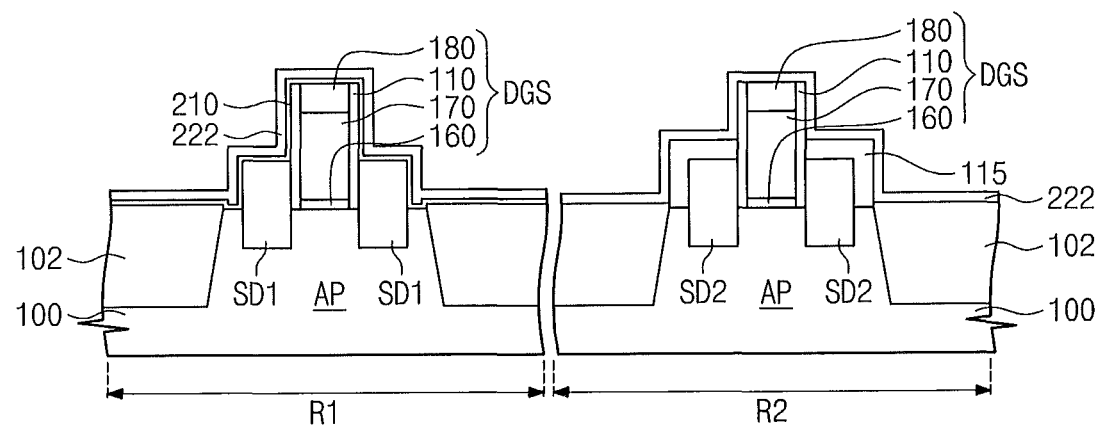
FIGS. 12 to 18 are cross-sectional views illustrating methods of manufacturing a semiconductor device according to some other embodiments of the inventive concepts.

Referring to FIG. 12, after the second mask layer 220 is removed from the resultant structure of FIG. 4, a second etch stop layer 222 may be formed on an entire surface of the substrate 100. For example, the second etch stop layer 222 may be formed of a nitride layer (e.g., a silicon nitride layer). The second etch stop layer 222 may extend along the top surface of the first etch stop layer 210 in the first region R1 and may extend to outer surfaces the dummy gate structure DGS and the sacrificial patterns 115 in the second region R2.

Figure 13:
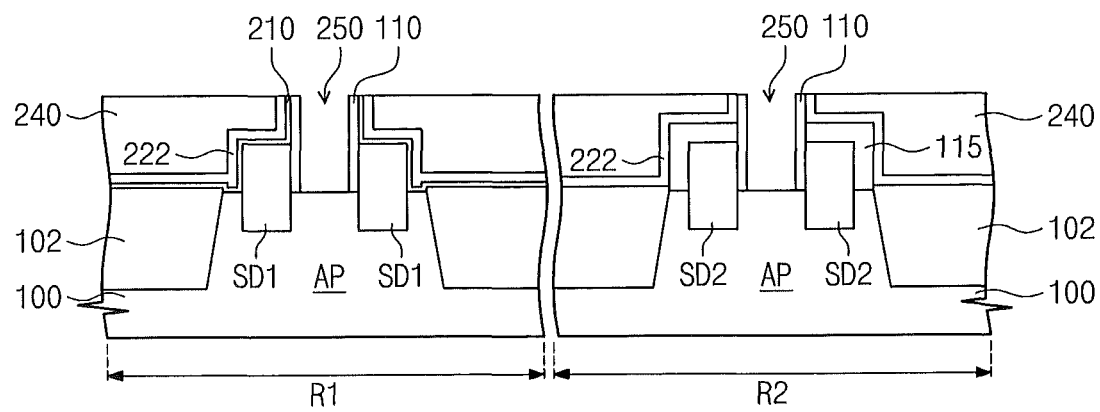

Referring to FIG. 13, a first interlayer insulating layer 240 may be formed on the resultant structure of FIG. 12. The first interlayer insulating layer 240 may include an oxide layer (e.g., a silicon oxide layer), a nitride layer (e.g., a silicon nitride layer), and/or an oxynitride layer (e.g., a silicon oxynitride layer), among others. The first interlayer insulating layer 240 may be planarized until top surfaces of the dummy gate patterns 170 are exposed. Subsequently, the dummy gate patterns 170 may be removed to form gap regions 250 that may each expose the substrate 100 between the gate spacers 110 in each of the first and second regions R1 and R2. Forming the gap regions 250 may include etching the dummy gate patterns 170 by an etching process having an etch selectivity with respect to the gate spacers 110, the first interlayer insulating layer 240 and the dummy gate dielectric patterns 160. Additionally, forming the gap regions 250 may further include removing the dummy gate dielectric patterns 160 to expose the active patterns AP.

Figure 14:
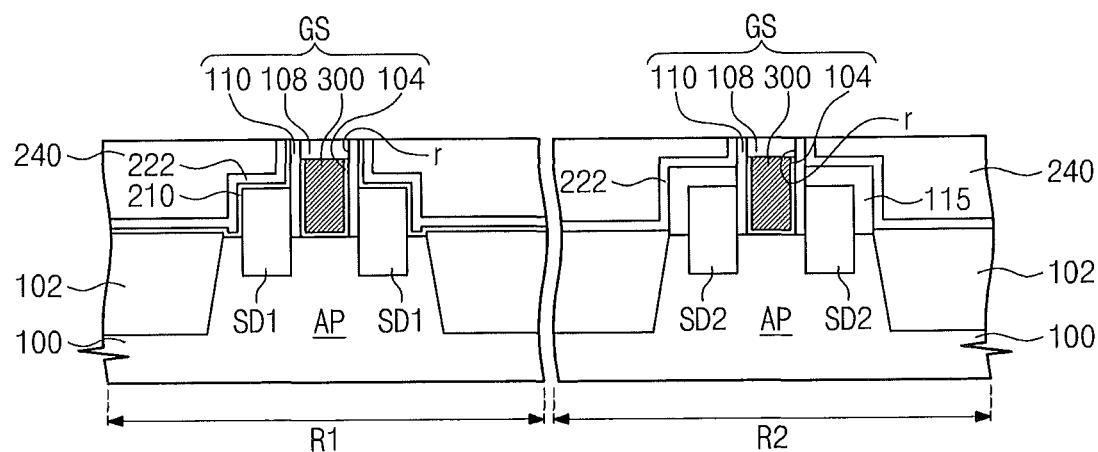

Referring to FIG. 14, a gate dielectric pattern 104 and a gate electrode 300 may be formed to fill the gap region 250 in each of the first and second regions R1 and R2.

A fifth mask layer (not shown) may be formed to cover the second region R2 of the resultant structure including the gap regions 250. The fifth mask layer may have an etch selectivity with respect to the first interlayer insulating layer 240, the gate spacers 110, and the substrate 100. For example, the fifth mask layer may be formed of an oxide layer (e.g., a silicon oxide layer), a nitride layer (e.g., a silicon nitride layer), and/or an oxynitride layer (e.g., a silicon oxynitride layer), among others. A gate dielectric layer (not shown) may be formed on the entire surface of the substrate 100 to partially fill the gap region 250 in the first region R1. The gate dielectric layer may include at least one of high-k dielectric layers. For example, the gate dielectric layer may include at least one of hafnium oxide, hafnium silicate, zirconium oxide, and zirconium silicate. However, the inventive concepts are not limited to the aforementioned materials of the gate dielectric layer. A gate layer (not shown) may be formed on the gate dielectric layer to fill the rest region of the gap region 250 of the first region R1. The gate layer may include at least one of a conductive metal nitride (e.g., titanium nitride or tantalum nitride) and a metal (e.g., aluminum or tungsten). The gate layer and the gate dielectric layer may be planarized to form the gate dielectric pattern 104 and the gate electrode 300 in the first region R1. Top surfaces of the first interlayer insulating layer 240 and the gate spacers 110 may be exposed in the first region R1 by the planarization process. The second region R2 may be protected by the fifth mask layer during the planarization process. According to some embodiments, the gate dielectric pattern 104 may be formed between the gate electrode 300 and the active pattern AP and between the gate electrode 300 and the gate spacers 110. Subsequently, upper portions of the gate dielectric pattern 104 and the gate electrode 300 may be etched to form a recess region r.

A capping pattern 108 may be formed to fill the recess region r in the first region R1. In more detail, a capping layer (not shown) may be formed on the resultant structure including the gate dielectric pattern 104 and the gate electrode 300. The capping layer may be formed to fill the recess region r in the first region R1. The capping layer may be formed of a nitride layer (e.g., a silicon nitride layer). The capping layer may be planarized until the first interlayer insulating layer 240 is exposed, thereby forming the capping pattern 108 in the recess region r of the first region R1. The gate dielectric pattern 104, the gate electrode 300, the capping pattern 108 and the gate spacers 110 may be defined as a gate structure GS.

The fifth mask layer may be removed to expose the gap region 250 in the second region R2. Subsequently, a sixth mask layer (not shown) may be formed to cover the first region R1. The sixth mask layer may have an etch selectivity with respect to the first interlayer insulating layer 240, the gate spacers 110, and the substrate 100. For example, the sixth mask layer may be formed of an oxide layer (e.g., a silicon oxide layer), a nitride layer (e.g., a silicon nitride layer), and/or an oxynitride layer (e.g., a silicon oxynitride layer), among others. A gate dielectric pattern 104, a gate electrode 300, and a capping pattern 108 may be formed to fill the gap region 250 in the second region R2 by the same method as the method of forming the gate dielectric pattern 104, the gate electrode 300 and the capping pattern 108 in the first region R1. The gate dielectric pattern 104 in the first region R1 may be formed of a different material from the gate dielectric pattern 104 in the second region R2. The gate electrode 300 in the first region R1 may be formed of a different material from the gate electrode 300 in the second region R2.

Figure 15:
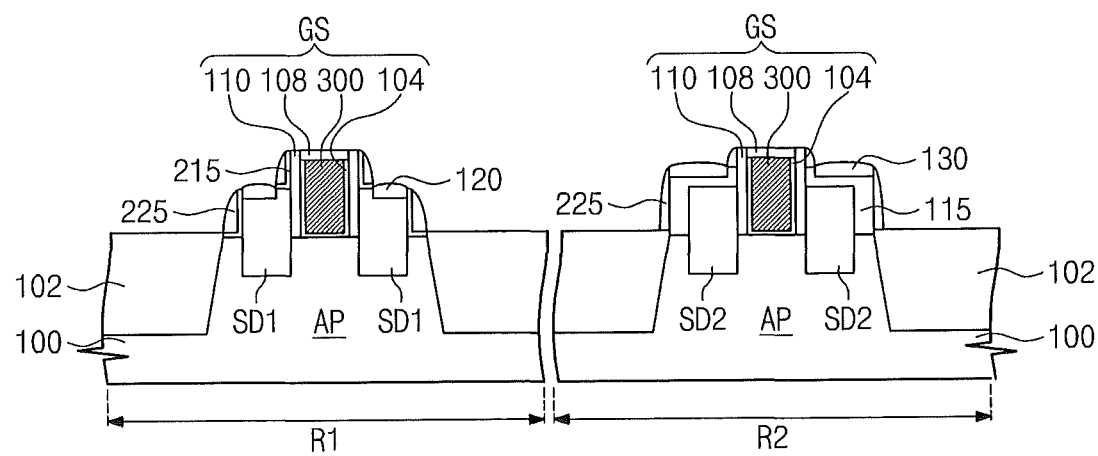

Referring to FIG. 15, the first interlayer insulating layer 240 may be removed. In the first region R1, the second etch stop layer 222 and the first etch stop layer 210 may be etched to form first etch stop patterns 215 and second etch stop patterns 225 on sidewalls of the gate structure GS and the first source/drain regions SD 1. An upper portion of the capping pattern 108 may be partially etched during the etching process. The top surfaces of the first source/drain regions SD1 may be exposed by the etching process. Additionally, the top surfaces of the device isolation patterns 102 may be exposed by the etching process. At the same time, the second etch stop patterns 225 may be formed on both sidewalls of the gate structure GS and sidewalls of the sacrificial patterns 115 in the second region R2. An upper portion of the capping pattern 108 may be partially etched during the etching process for forming the second etch stop patterns 225 in the second region R2. The top surfaces of the sacrificial patterns 115 may be exposed by the etching process. Additionally, the top surfaces of the device isolation patterns 102 may also be exposed by the etching process in the second region R2.

Thereafter, an oxidation process may be performed on the substrate 100 to form first mask patterns 120 on the first source/drain regions SD1 and second mask patterns 130 on the sacrificial patterns 115. A detail method of forming the first and second mask patterns 120 and 130 may be the same as the methods described with reference to FIG. 5.

Figure 16:
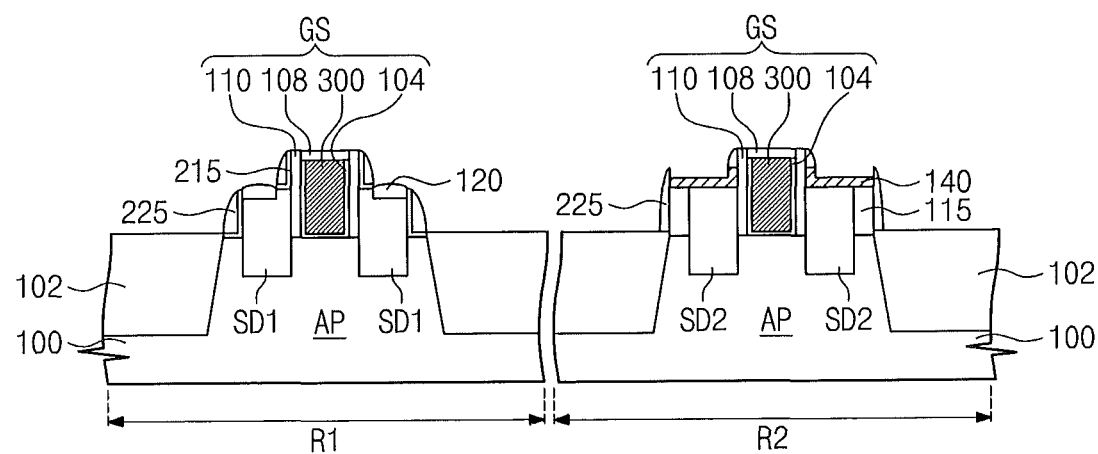

Referring to FIG. 16, the second mask patterns 130 may be selectively removed. Additionally, portions of the sacrificial patterns 115 not oxidized during the oxidation process may also be removed. The top surfaces of the second source/drain regions SD2 may be exposed by the removal of the second mask patterns 130 and the portions of the sacrificial patterns 115.

First patterns 140 may be formed on the exposed second source/drain regions SD2. The first patterns 140 may be formed by the same methods as described with reference to FIG. 6.

Figure 17:
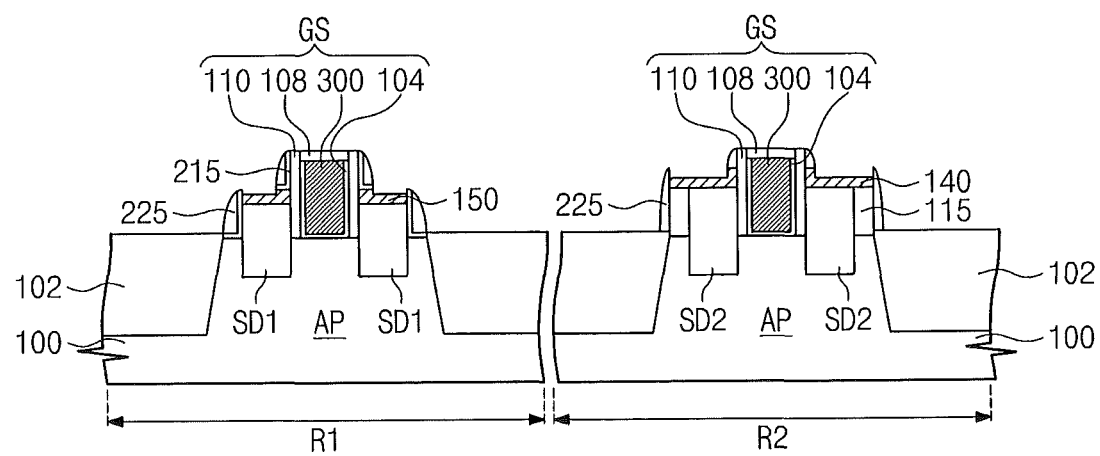

Referring to FIG. 17, the first mask patterns 120 may be removed after the formation of the first patterns 140. The top surfaces of the first source/drain regions SD1 may be exposed by the removal of the first mask patterns 120. Second patterns 150 may be formed on the exposed first source/drain regions SD1. The second patterns 150 may be formed by the same methods as described with reference to FIG. 7.

Figure 18:
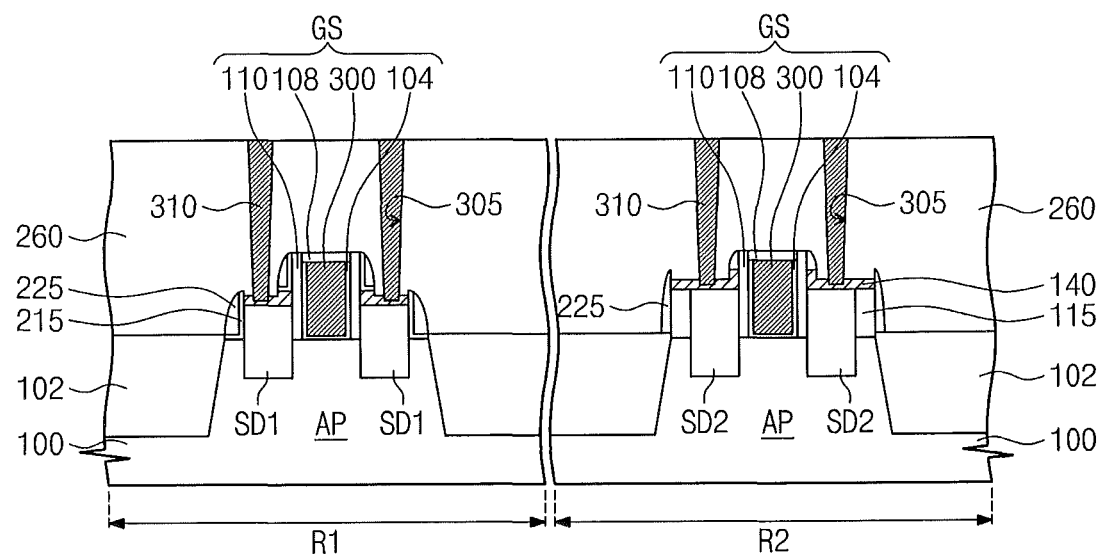

Referring to FIG. 18, a second interlayer insulating layer 260 may be formed on the resultant structure of FIG. 17. The second interlayer insulating layer 260 may be formed of an oxide layer (e.g., a silicon oxide layer), a nitride layer (e.g., a silicon nitride layer), and/or an oxynitride layer (e.g., a silicon oxynitride layer), among others. Contact holes 305 may be formed to penetrate the second interlayer insulating layer 260. The contact holes 305 may expose the first patterns 140 and the second patterns 150, respectively. Subsequently, contact plugs 310 may be formed to fill the contact holes 305, respectively. The second patterns 150 may be ohmic patterns for ohmic contact between the first source/drain regions SD1 and the contact plugs 310 in the first region R1. The first patterns 140 may be ohmic patterns for ohmic contact between the second source/drain regions SD2 and the contact plugs in the second region R2.

FIGS. 19 to 22 are cross-sectional views illustrating methods of manufacturing a semiconductor device according to some other embodiments of the inventive concepts. In the present embodiment, the same elements as described with reference of FIGS. 3 to 6, 7A, 7B, 8, 9 and 12 to 18 will be indicated by the same reference numerals or the same designators, and the descriptions to the same elements will be omitted or mentioned briefly for the purpose of ease and convenience in explanation.

Figure 19:
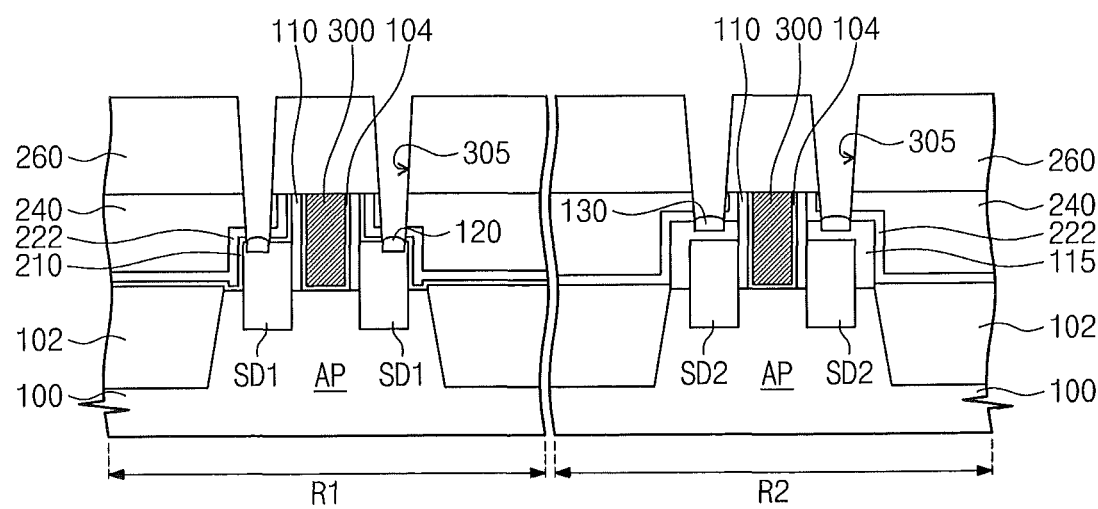
FIGS. 19 to 22 are cross-sectional views illustrating methods of manufacturing a semiconductor device according to some other embodiments of the inventive concepts.

Referring to FIG. 19, gate dielectric patterns 140 and gate electrodes 300 may be formed in the gap regions 250 of the structure described with reference to FIG. 13. The gate dielectric patterns 104 and the gate electrodes 300 may be formed by the same methods as the methods of the gate dielectric patterns 104 and the gate electrodes 300 described with reference to FIG. 9. In other words, the gate dielectric pattern 104 and the gate electrode 300 disposed in the first region R1 may be formed independently of the gate dielectric pattern 104 and the gate electrode 300 disposed in the second region R2. The gate dielectric pattern 104 may be formed between the gate electrode 300 and the active pattern AP and between the gate electrode 300 and the gate spacers 110.

A second interlayer insulating layer 260 may be formed on an entire surface of the substrate 100. The second interlayer insulating layer 260 may be formed of an oxide layer (e.g., a silicon oxide layer), a nitride layer (e.g., a silicon nitride layer), and/or an oxynitride layer (e.g., a silicon oxynitride layer), among others. Contact holes 305 may be formed to penetrate the second interlayer insulating layer 260 and the first interlayer insulating layer 240. In the first region R1, the contact holes 305 may be formed to expose the first source/drain regions SD1. In the second region R2, the contact holes 305 may be formed to expose the sacrificial patterns 115. The contact holes 305 of the first region R1 and the contact holes 305 of the second region R2 may be formed at the same time or at different times from each other.

An oxidation process may be performed on the substrate 100 to form first mask patterns 120 on the first source/drain regions SD1 exposed by the contact holes 305 of the first region R1 and second mask patterns 130 on the sacrificial patterns 115 exposed by the contact holes 305 of the second region R2. The first and second mask patterns 120 and 130 may be formed by the methods described with reference to FIG. 5.

Figure 20:
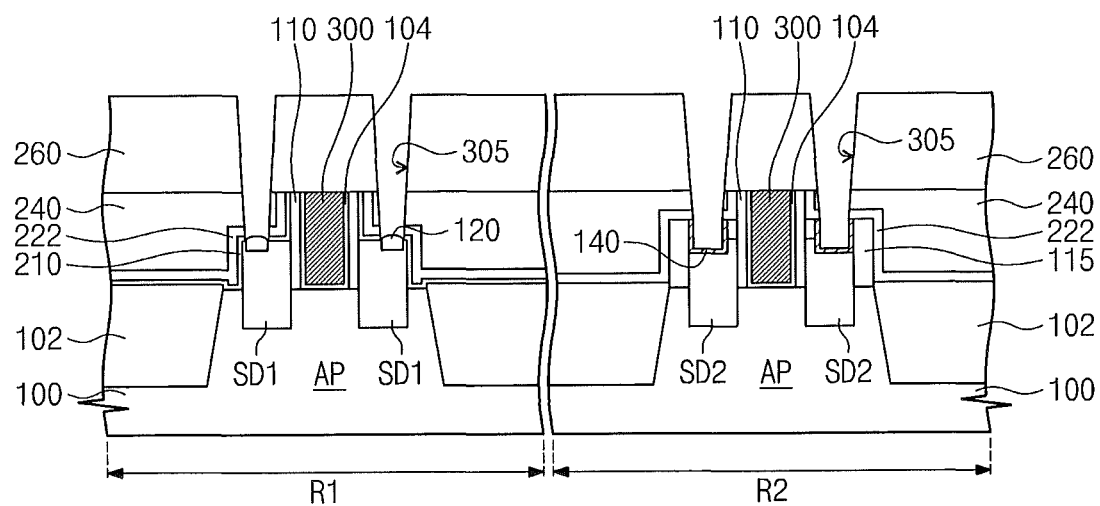

Referring to FIG. 20, the second mask patterns 130 may be selectively removed. Additionally, portions of the sacrificial patterns 115 not oxidized during the oxidation process may also be removed. The second mask patterns 130 and the portions of the sacrificial patterns 115 may be removed to expose the top surfaces of the second source/drain regions SD2.

First patterns 140 may be formed on the exposed second source/drain regions SD2. Forming the first patterns 140 may include forming a first metal layer on an entire surface of the substrate 100, reacting the first metal layer with the exposed second source/drain regions SD2, and removing an unreacted portion of the first metal layer. The first metal layer may be conformally formed along bottom surfaces and inner sidewalls of the contact holes 305. The first metal layer may react with the exposed second source/drain regions SD2 by a first annealing process. During the first annealing process, the first metal layer may also react with portions of the sacrificial patterns that are exposed by lower sidewalls of the contact holes 305 in the second region R2. Thus, the first patterns 140 may extend from the bottom surfaces onto the lower sidewalls of the contact holes 305.

Figure 21:
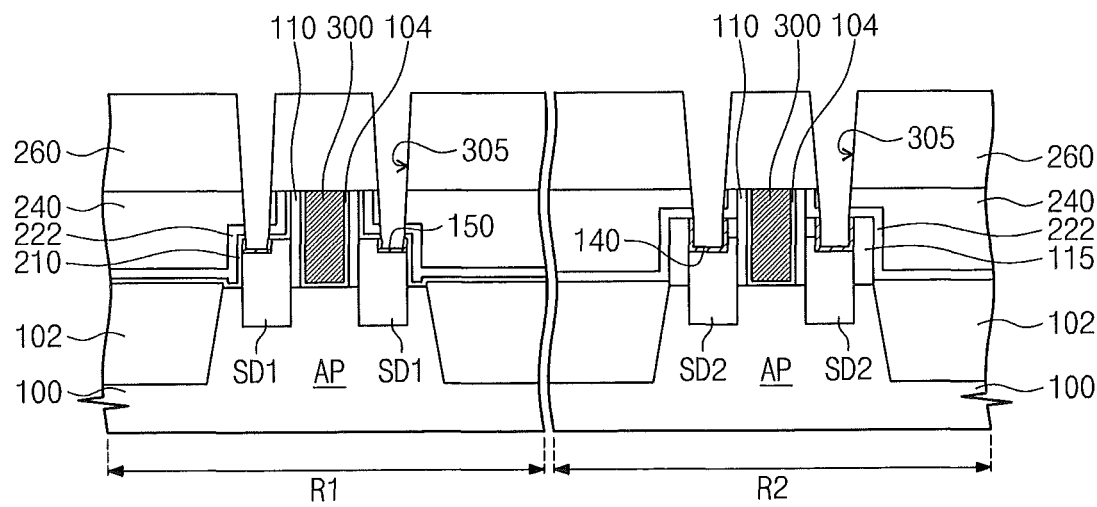

Referring to FIG. 21, the first mask patterns 120 may be removed after the formation of the first patterns 140. The first mask patterns 120 may be removed such that the top surfaces of the first source/drain regions SD1 may be exposed by the contact holes 305 in the first region R1. Second patterns 150 may be formed on the exposed first source/drain regions SD1. The second patterns 150 may be formed by the same method as described with reference to FIG. 7. The second patterns 150 may extend from the bottom surfaces onto lower sidewalls of the contact holes 305 in the first region R1.

Figure 22:
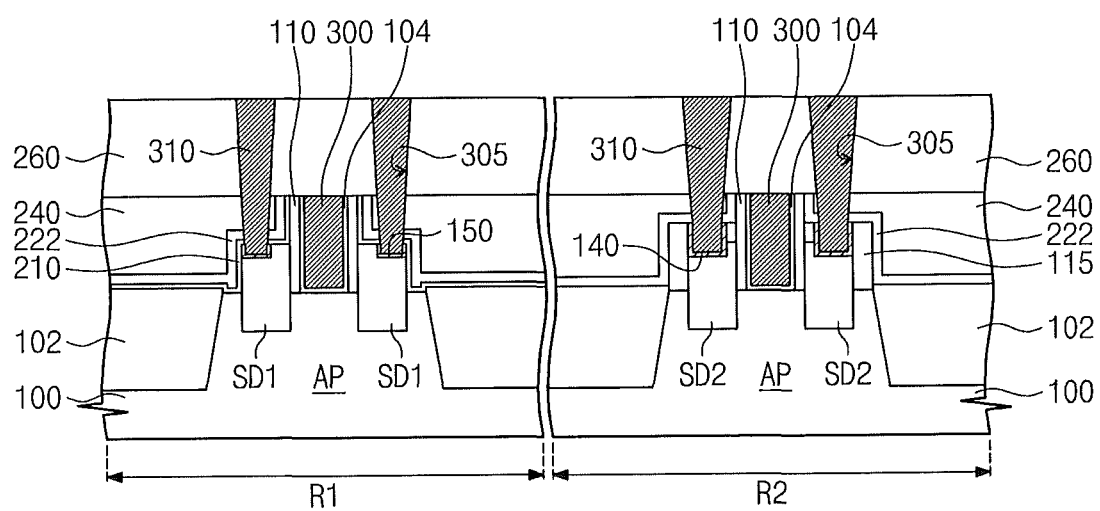

Referring to FIG. 22, contact plugs 310 may be formed to fill the contact holes 305, respectively. The second patterns 150 may be ohmic patterns that provide ohmic contact between the first source/drain regions SD1 and the contact plugs 310 of the first region R1. The first patterns 140 may be ohmic patterns that provide ohmic contact between the second source/drain regions SD2 and the contact plugs 310 of the second region R2.

Structural features of the semiconductor device according to the inventive concepts will be described with reference again to FIG. 2D.

A substrate 100 may include a first region R1 and a second region R2. The first region R1 and the second region R2 may correspond to different regions from each other of the substrate 100. A field effect transistor disposed in the first region R1 may have a threshold voltage different from a threshold voltage of a field effect transistor in the second region R2. Device isolation patterns 102 may be disposed in or on the substrate to define active patterns AP. The device isolation patterns 102 may include an oxide layer (e.g., a silicon oxide layer), a nitride layer (e.g., a silicon nitride layer), and/or an oxynitride layer (e.g., a silicon oxynitride layer), among others. Gate patterns 106 may be formed in the first region R1 and the second region R2, respectively. Gate dielectric patterns 104 may be disposed between the gate patterns 106 and the active patterns AP, respectively.

Capping patterns 018 may be disposed on the gate patterns 106, respectively. Gate spacers 110 may be disposed on both sidewalls of the gate dielectric pattern 104, the gate pattern 106 and the capping pattern 108 that are sequentially stacked in each of the first and second regions R1 and R2.

Source/drain regions may be disposed at both sides of each of the gate patterns 106. The source/drain regions may include first source/drain regions SD1 disposed in the first region R1 and second source/drain regions disposed in the second region R2. Sidewall protection patterns 118 may be disposed on both sidewalls of each of the gate patterns 106. A gate spacer 110 may be disposed between each sidewall protection pattern 118 and each sidewall of each gate pattern 106. Additionally, the sidewall protection patterns 118 may be disposed on sidewalls of the source/drain regions SD1 and SD2. Furthermore, a sacrificial pattern 115 may be disposed between each of the second source/drain regions SD2 and the sidewall protection pattern 118 in the second region R2. The sacrificial patterns 115 may include germanium (Ge).

First patterns 140 may be disposed on the second source/drain regions SD2, and second patterns 150 may be disposed on the first source/drain regions SD1. The first patterns 140 may include an element different from elements constituting the second patterns 150. According to embodiments described with reference to FIG. 10B, the first pattern 140 and the second pattern 150 may include elemental semiconductors different from each other. In some embodiments, the first patterns 140 may include a metal germanide, and the second patterns may include a metal silicide. The first patterns 140 may be ohmic patterns that provide ohmic contact between the second sourced/drain regions SD2 and contact plugs electrically connected to the second source/drain regions SD2. The second patterns 150 may be ohmic patterns that provide ohmic contact between the first sourced/drain regions SD1 and contact plugs electrically connected to the first source/drain regions SD 1.

According to some embodiments of the inventive concepts, the sacrificial patterns 115 may be formed on at least one of the source/drain regions SD 1 and SD2 and then the oxidation process may be performed to form the first mask patterns 120 and the second mask patterns 130 having the etch selectivity with respect to each other at the same time. Thus, the manufacturing processes of the semiconductor device may be simplified and the manufacturing costs of the semiconductor device may be reduced. Additionally, the first patterns 140 and the second patterns 150 may be formed using the etch selectivity of the first and second mask patterns 120 and 130 in the second region R2 and the first region R1, respectively. The first patterns 140 may include the element different from the elements constituting the second patterns 150. Thus, resistances of the contact plugs 310 electrically connected to the source/drain regions SD1 and SD2 may be reduced by the first and second patterns 140 and 150 disposed therebetween.

Figure 23:
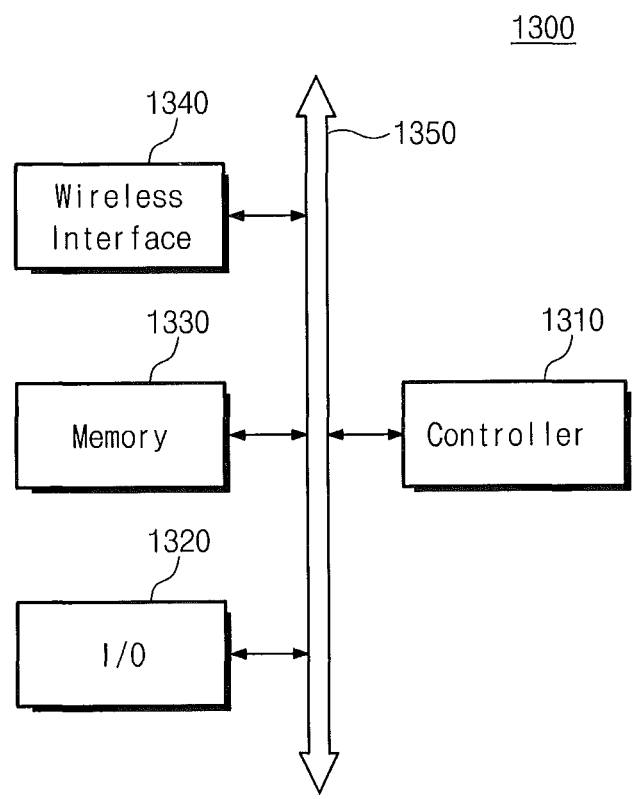
FIGS. 23 and 24 are schematic block diagrams illustrating electronic devices including semiconductor devices according to some embodiments of the inventive concepts.
Figure 24:
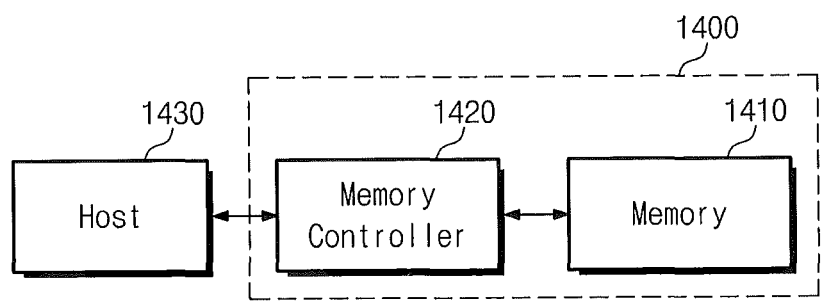

FIGS. 23 and 24 are schematic block diagrams illustrating electronic devices including semiconductor devices according to some embodiments of the inventive concepts.

Referring to FIG. 23, an electronic device 1300 including the semiconductor device according to some embodiments of the inventive concepts may be one of a personal digital assistant (PDA), a laptop computer, a portable computer, a web tablet, a wireless phone, a mobile phone, a digital music player, a cable/wireless electronic device, and/or any composite electronic device including at least two thereof. The electronic device 1300 may include a controller 1310, an input/output (I/O) unit 1320 (e.g., a keypad, a keyboard, or a display), a memory device 1330, and a wireless interface unit 1340 that are coupled to each other through a data bus 1350. For example, the controller 1310 may include at least one of a microprocessor, a digital signal processor, a microcontroller, and/or another logic device having a similar function to any one thereof. The memory device 1330 may store, for example, commands executed through the controller 1310. Additionally, the memory device 1330 may store user's data. The memory device 1330 may include at least one of the semiconductor devices according to embodiments of the inventive concepts disclosed herein. The electronic device 1300 may use the wireless interface unit 1340 in order to transmit data to a wireless communication network communicating with a radio frequency (RF) signal and/or in order to receive data from the network. For example, the wireless interface unit 1340 may include antenna or a wireless transceiver. The electronic device 1300 may be used in a communication interface protocol of a communication system such as CDMA, GSM, NADC, E-TDMA, WCDMA, CDMA2000, Wi-Fi, Muni Wi-Fi, Bluetooth, DECT, Wireless USB, Flash-OFDM, IEEE 802.20, GPRS, iBurst, WiBro, WiMAX, WiMAX-Advanced, UMTS-TDD, HSPA, EVDO, LTE-Advanced, and/or MMDS, among others.

Referring to FIG. 24, the semiconductor devices according to some embodiments of the inventive concepts may be used in order to realize memory systems. A memory system 1400 may include a memory device 1410 and a memory controller 1420 for storing massive data. The memory controller 1420 may control the memory device 1410 in order to read or write data from/into the memory device 1410 in response to read/write request of a host 1430. The memory controller 1420 may make an address mapping table for mapping an address provided from the host 1430 (e.g., a mobile device or a computer system) into a physical address of the memory device 1410. The memory device 1410 may include at least one of the semiconductor devices according to embodiments of the inventive concepts as disclosed herein.

A package in which the semiconductor device according to one of the above embodiments is mounted may further include a controller and/or a logic device for controlling the data storage device.

According to some embodiments of the inventive concepts, the sacrificial patterns may be formed on at least one of the source/drain regions and then the oxidation process may be performed to form the first mask patterns and the second mask patterns having the etch selectivity with respect to each other in the first region and the second region of the substrate at the same. Thus, the manufacturing processes of the semiconductor device may be simplified and the manufacturing costs of the semiconductor device may be reduced.

The first patterns and the second patterns may be formed using the etch selectivity of the first and second mask patterns in the first region and the second region, respectively. The first patterns may include an element that is different from the element constituting the second patterns. Thus, resistances of the contact plugs electrically connected to the source/drain regions may be reduced by the first and second patterns disposed therebetween.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A method of manufacturing a semiconductor device, the method comprising:
   providing a substrate including a first region and a second region that is different from the first region;
   forming first source/drain regions in the first region;
   forming second source/drain regions in the second region;
   forming sacrificial patterns on the first source/drain regions in the first region;
   performing an oxidation process to form first mask patterns on the first source/drain regions and second mask patterns on the second source/drain regions;
   wherein the second mask patterns have an etch selectivity with respect to the first mask patterns,
   wherein portions of the sacrificial patterns are oxidized to form the first mask patterns, and
   wherein top surfaces of the second source/drain are oxidized to form the second mask patterns during the oxidation process,
   the method further comprising:
   selectively removing the first mask patterns;
   forming the first patterns on the first source/drain regions in the first region;
   removing the second mask patterns after forming the first patterns; and
   forming second patterns on the second source/drain regions in the second region,
   wherein the first patterns include a first element and the second patterns include a second element that is different from the first element,
   wherein the first patterns are ohmic patterns that contact the first source/drain regions,
   wherein the second patterns are ohmic patterns that contact the second source/drain regions,
   wherein forming the first pattern comprises:
   removing residual portions of the sacrificial patterns that are not oxidized to expose the first source/drain regions;
   forming a first metal layer on the exposed first source/drain regions:
   reacting the first metal layer with the first source/drain regions; and
   removing an unreacted portion of the first metal layer that does not react with the first source/drain regions.

2. The method of claim 1, wherein the sacrificial patterns include germanium (Ge).

3. The method of claim 1, wherein the first mask patterns include germanium oxide, and wherein the second mask patterns include silicon oxide.

4. The method of claim 1, wherein forming the second patterns on the second source/drain regions comprises:
   forming a second metal layer on the second source/drain regions exposed by removing the second mask patterns;
   reacting the second metal layer with the second source/drain regions; and
   removing an unreacted portion of the second metal layer that does not react with the second source/drain regions.

5. The method of claim 1, further comprising:
   forming first contact plugs that are electrically connected to the first source/drain regions, wherein the first patterns are arranged between the first contact plugs and the first source/drain regions; and forming second contact plugs that are electrically connected to the second source/drain regions, wherein the second patterns are arranged between the second contact plugs and the second source/drain regions.

6. A method of manufacturing a semiconductor device, the method comprising:
providing a substrate including a first region and a second region that is different from the first region;
forming first mask patterns on first source/drain regions in the first region;
forming, on second source/drain regions in the second region, second mask patterns having an etch selectivity with respect to the first mask patterns, while forming the first mask patterns;
selectively removing the first mask patterns;
forming first patterns on the first source/drain regions in the first region;
removing the second mask patterns after forming the first patterns; and
forming second patterns on the second source/drain regions in the second region,
wherein the first patterns are ohmic patterns that contact the first source/drain regions,
wherein the second patterns are ohmic patterns that contact the second source/drain regions,
wherein forming the first mask patterns comprises forming sacrificial patterns on the first source/drain regions,
wherein portions of the sacrificial patterns are oxidized to form the first mask patterns,
wherein forming the first patterns comprises:
removing residual portions of the sacrificial patterns that are not oxidized to expose the first source/drain regions;
forming a metal layer on the exposed first source/drain regions;
reacting the metal layer with the first source/drain regions; and
removing an unreacted portion of the metal layer that does not react with the first source/drain regions.

* * * * *